(12) United States Patent
Liaw

(10) Patent No.: US 12,114,473 B2
(45) Date of Patent: Oct. 8, 2024

(54) THREE-PORT SRAM CELL AND LAYOUT METHOD

(71) Applicant: Taiwan Semiconductor Manufacturing Company, Ltd., Hsinchu (TW)

(72) Inventor: Jhon-Jhy Liaw, Zhudong Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 205 days.

(21) Appl. No.: 17/828,123

(22) Filed: May 31, 2022

(65) Prior Publication Data

US 2023/0389260 A1    Nov. 30, 2023

(51) Int. Cl.

| G11C 7/12 | (2006.01) |
| G11C 11/412 | (2006.01) |
| G11C 11/413 | (2006.01) |
| G11C 11/419 | (2006.01) |
| H10B 10/00 | (2023.01) |
| G11C 8/08 | (2006.01) |
| G11C 8/16 | (2006.01) |

(52) U.S. Cl.
CPC ............ *H10B 10/18* (2023.02); *G11C 11/412* (2013.01); *G11C 11/413* (2013.01); *G11C 11/419* (2013.01); *G11C 7/12* (2013.01); *G11C 8/08* (2013.01); *G11C 8/16* (2013.01)

(58) Field of Classification Search
CPC ..... H10B 10/18; G11C 11/412; G11C 11/413; G11C 11/419; G11C 8/16
See application file for complete search history.

(56) References Cited

U.S. PATENT DOCUMENTS

| 9,424,889 | B1 | 8/2016 | Liaw | |
| 9,659,599 | B1 | 5/2017 | Liaw | |
| 9,905,290 | B2 | 2/2018 | Liaw | |
| 2011/0068413 | A1* | 3/2011 | Liaw | G11C 11/412 |
| | | | | 257/E27.06 |
| 2015/0357279 | A1* | 12/2015 | Fujiwara | H01L 27/092 |
| | | | | 257/499 |
| 2020/0320174 | A1* | 10/2020 | Sautter | G06F 30/327 |
| 2024/0040763 | A1* | 2/2024 | Liaw | H10B 10/125 |

\* cited by examiner

*Primary Examiner* — Mushfique Siddique
(74) *Attorney, Agent, or Firm* — McClure, Qualey & Rodack, LLP

(57) ABSTRACT

Semiconductor devices are provided. A write port circuit is configured to perform a write function according to the write word line and the first and second write bit lines. The first read port circuit is configured to perform first read function according to the first read bit line and the first read word line. The second read port circuit is configured to perform second read function according to the second read bit line and the second read word line. The transistors of the first and second read port circuits share a first active structure extending in the first direction. The first read bit line and the second read bit line extend in the first direction in a first metallization layer, and the first write bit line and the second write bit line extend in the first direction in a second metallization layer over the first metallization layer.

20 Claims, 19 Drawing Sheets

THREE-PORT SRAM CELL AND LAYOUT METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling down has also increased the complexity of processing and manufacturing ICs and, for these advancements to be realized, similar developments in IC processing and manufacturing are needed.

Memories are commonly used in integrated circuits. For example, a static random access memory (SRAM) is a volatile memory used in electronic applications where high speed, low power consumption, and simplicity of operation are needed. Embedded SRAM is particularly popular in high-speed communications, image processing, and system-on-chip (SOC) applications. SRAM has the advantage of being able to hold data without requiring a refresh.

SRAM includes a plurality of bit cells disposed in rows and columns to form an array. Each bit cell includes a plurality of transistors coupled to bit lines and word lines that are used to read and write a bit of data to the memory cell.

In deep sub-micron technology, the embedded SRAM has become a very popular storage unit for high-speed communication, image processing and SOC products. In particular, three-port SRAM allows parallel operations (e.g., 1 cycle may include two read operations) and therefore have higher bandwidth than the signal-port SRAM. In order to meet the shrink requirements, the low loading, high speed cell structure become very important factors in embedded memory and SOC products.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
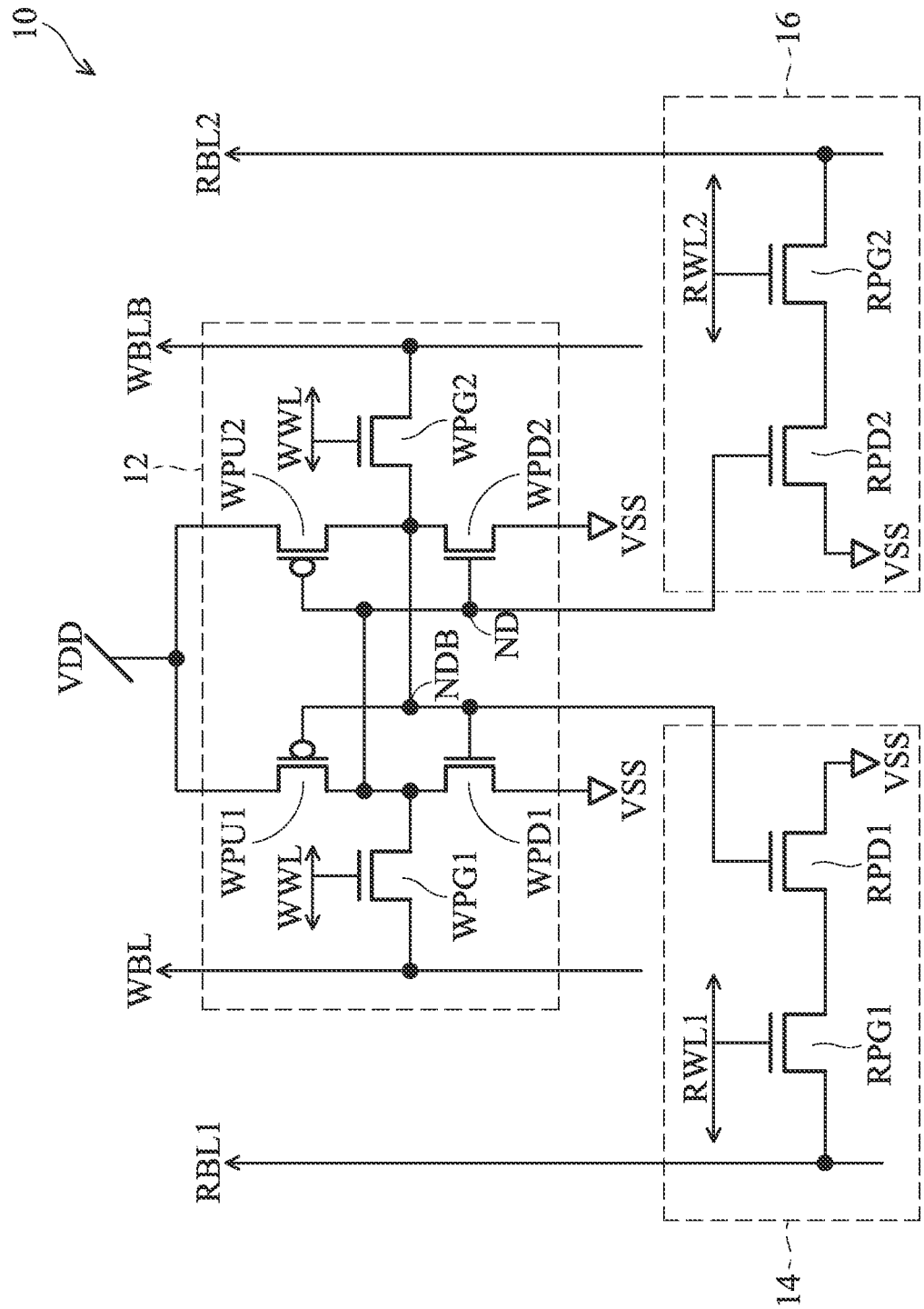
FIG. 1 shows a schematic circuit diagram of a three-port memory cell, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a schematic circuit diagram of a three-port memory cell 10, in accordance with some embodiments of the disclosure. In some embodiments, the memory cell 10 is a static random access memory (SRAM) cell. The memory cell 10 includes a write port circuit 12 having data nodes ND and NDB, a first read port circuit 14 coupled to the data node NDB, and a second read port circuit 16 coupled to the data node ND.

The write port circuit 12 is configured to perform a write function according to a write word line WWL and the write bit lines WBLB and WBL. The write port circuit 12 includes the pull-up transistors WPU1 and WPU2, the pull-down transistors WPD1 and WPD2, and the pass-gate transistors WPG1 and WPG2. The pull-up transistors WPU1 and WPU2 are P-type transistors, and the pull-down transistors WPD1 and WPD2, and the pass-gate transistors WPG1 and WPG2 are N-type transistors. The pull-up transistors WPU1 and WPU2 and the pull-down transistors WPD1 and WPD2 form a cross latch having two cross-coupled inverters. The pull-up transistor WPU1 and the pull-down transistor WPD1 form a first inverter, and the pull-up transistor WPU2 and the pull-down transistor WPD2 form a second inverter. The drains of the pull-up transistor WPU1 and the pull-down transistor WPD1 are coupled together and form the data node ND. The drains of the pull-up transistor WPU2 and the pull-down transistor WPD2 are coupled together and form the data node NDB. The gates of the pull-up transistor WPU1 and the pull-down transistor WPD1 are coupled together and to the data node NDB. The gates of the pull-up transistor WPU2 and the pull-down transistor WPD2 are coupled together and to the data node ND. The sources of the pull-up transistors WPU1 and WPU2 are coupled to a supply voltage node that is configured to receive a supply voltage VDD. The sources of the pull-down transistors WPD1 and WPD2 are coupled to the ground VSS.

In the write port circuit 12, the pass-gate transistor WPG1 is coupled between the data node ND and a write bit line WBL, and the pass-gate transistor WPG2 is coupled between the data node NDB and a write bit line WBLB. The gates of the pass-gate transistors WPG1 and WPG2 are coupled to a write word line WWL.

In the write port circuit 12, the pull-up transistor WPU1 and the pull-down transistor WPD1 are coupled in series between the supply voltage VDD and the ground VSS, and the pull-up transistor WPU2 and the pull-down transistor WPD2 are coupled in series between the supply voltage VDD and the ground VSS. Furthermore, the pull-up transistor WPU1 and the pass-gate transistor WPG1 are coupled in series between the supply voltage VDD and the write bit line WBL, and the pull-up transistor WPU2 and the pass-gate transistor WPG2 are coupled in series between the supply voltage VDD and the write bit line WBLB.

In some embodiments, in a memory array having a plurality of memory cells each having a configuration the same as the memory cell 10, the write bit lines WBLB and WBL are coupled to the pass-gate transistors WPG1 and WPG2 of memory cells in a column of the memory array, and the write word line WWL is coupled to each gate of the pass-gate transistors WPG1 and WPG2 of the memory cells in a row of the memory array.

In a write operation of memory cell 10 using the write port circuit 12, data to be written to the memory cell 10 are applied to the write bit lines WBL and WBLB. The data in the write bit lines WBL and WBLB are complementary. The write word line WWL is then activated to turn on the pass-gate transistors WPG1 and WPG2. As a result, the data on bit lines WBL and WBLB are transferred to the corresponding nodes ND and NDB for storage.

The first read port circuit 14 is configured to perform a first read function according to the first read bit line RBL1 and the first read word line RWL1. The first read port circuit 14 includes the pass-gate transistor RPG1 and the pull-down transistor RPD1 connected in series. The pull-down transistor RPD1 is coupled between the ground VSS and the pass-gate transistor RPG1. A gate of the pull-down transistor RPD1 is coupled to the data node NDB. The pass-gate transistor RPG1 is coupled between the pull-down transistor RPD1 and the first read bit line RBL1. The gate of the pass-gate transistor RPG1 is coupled to the first read word line RWL1.

In a read operation of memory cell 10 using the first read port circuit 14, the read bit line RBL1 is pre-charged with a high voltage (e.g., a high logic level). The first read word line RWL1 is activated with a high voltage (e.g., a high logic level) to turn on the pass-gate transistor RPG1. The data stored in the node NDB turns on or off the pull-down transistor RPD1. For example, if the data with a high logic level is stored in the node NDB, the pull-down transistor RPD1 is turned on. The turned-on transistors RPD1 and RPG1 then pull the first read bit line RBL1 to the ground. On the other hand, if the data with a low logic level is stored in the node NDB, the pull-down transistor RPD1 is turned off and operates as an open circuit. As a result, the first read bit line RBL1 remains at the pre-charged high logic level. Detecting a logical value on the first read bit line RBL1 therefore reveals the logical value of the data stored in the node NDB.

The second read port circuit 16 is configured to perform a second read function according to the second read bit line RBL2 and the second read word line RWL2. The second read port circuit 16 includes the pass-gate transistor RPG2 and the pull-down transistor RPD2 connected in series. The pull-down transistor RPD2 is coupled between the ground VSS and the pass-gate transistor RPG2. A gate of the pull-down transistor RPD2 is coupled to the data node ND. The pass-gate transistor RPG2 is coupled between the pull-down transistor RPD2 and the second read bit line RBL2. The gate of the pass-gate transistor RPG2 is coupled to the second read word line RWL2.

A read operation of memory cell 10 using the second read port circuit 16 is performed in a manner similar to performing a read operation of the first read port circuit 14, and the detailed description thereof is thus omitted. As a result, if the data node ND stores a high logic level, the second read bit line RBL2 is pulled to the ground. On the other hand, if the data node ND stores a low logic level, the second read bit line RBL2 remains at the pre-charged high logic level. Detecting a logic level of the second read bit line RBL2 therefore reveals the logic level of the data stored in the data node ND.

Memory cell 10 is illustrated as an example. In some embodiments, the present application is applicable to a multiple-port SRAM cell having one or more write ports and/or one or more read ports.

Figure 2:
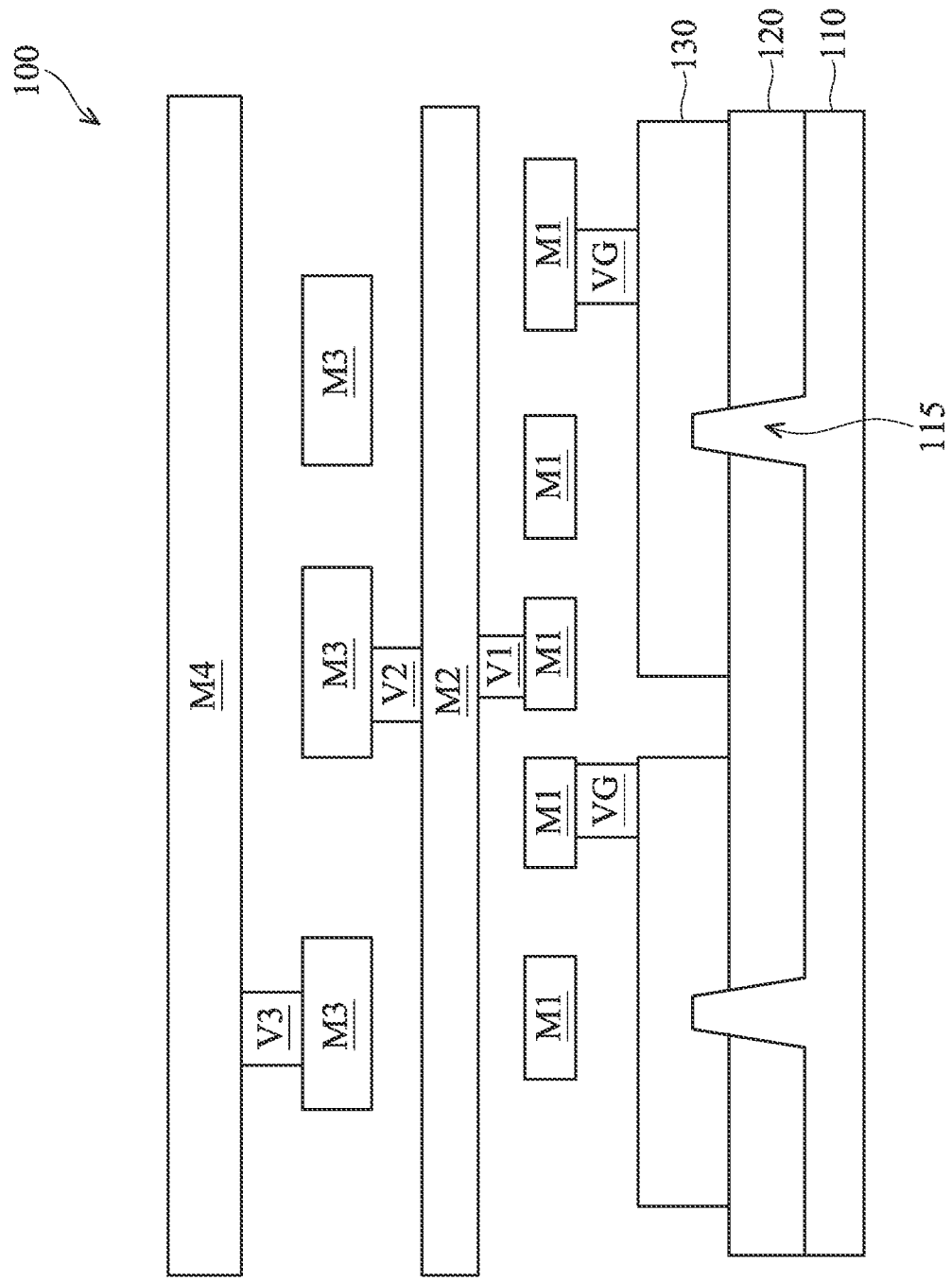
FIG. 2 shows a cross sectional view of a semiconductor device, in accordance with some embodiments of the disclosure.

FIG. 2 shows a cross sectional view of a semiconductor device 100, in accordance with some embodiments of the disclosure. In the semiconductor device 100, one or more memory cells 10 as illustrated in the disclosure are formed. Furthermore, Some components of semiconductor device 100 are not depicted for clarity of FIG. 2.

The semiconductor device 100 includes a well region 110. In some embodiments, the well region 110 is a P-type well region, and the material of the P-type well region includes Si with Boron (B) doping. In some embodiments, the well region 110 is an N-type well region, and the material of the N-type well region includes Si with Phosphorus (P) doping. The active structures (or the active regions) 115 are formed over the well region 110, and the gate structures 130 are formed over the active structures 115.

The gate vias VG are formed over and connected to the gate structures 130 (e.g., the gate structures). Isolation feature 120 is over the well region 110 and under the gate structure 110. The isolation feature 120 is used for isolating the active structure 115 of a transistor from other devices. In some embodiments, the isolation feature 120 may include different structures, such as shallow trench isolation (STI) structure, deep trench isolation (DTI) structure. Therefore, the isolation feature 120 is also referred as to as a STI feature or DTI feature.

The semiconductor device 100 further includes the vias V1, V2, and V3 and the metal lines M1, M2, M3 and M4 in an inter-metal dielectric (IMD). In some embodiments, the IMD may be multilayer structure, such as one or more dielectric layers. The metal lines M1, M2, M3 and M4 are formed in respective conductive layers, which are also referred to as metallization layers. Moreover, the vias VG, V0 (not shown), V1, V2, and V3 are formed in respective via layers over the gate structures 130.

In FIG. 2, the conductive layers of the semiconductor device 100 include a first metallization layer having first conductive features (e.g., the metal lines MD, a second metallization layer having second conductive features (e.g., the metal lines M2), a third metallization layer having third conductive features (e.g., the metal lines M3), and a fourth metallization layer having fourth conductive features (e.g., the metal lines M4).

The via layers of semiconductor device 100 include a base via layer having the vias V0 (not shown) and the vias VG, a first via layer having the vias V1, a second via layer having the vias V2, and a third via layer having the vias V3. The vias V0 and the vias VG are arranged to connect at least some of the conductive structures (contacts) and the gate structures 130 with corresponding first metal lines M1. The vias V1 are arranged to connect at least some first metal lines M1 with the corresponding second metal lines M2. The vias V2 are arranged to connect at least some second metal lines M2 with the corresponding third metal lines M3. The vias V3 are arranged to connect at least some third metal lines M3 with the corresponding fourth metal lines M4.

FIG. 2 is used as to demonstrate the spatial relationship among various metallization layers and via layers. In some embodiments, the numbers of conductive features at various layers are not limited to the example depicted in FIG. 2. In some embodiments, there are one or more metallization layers and one or more via layers over the fourth metal lines M4.

Figure 3:
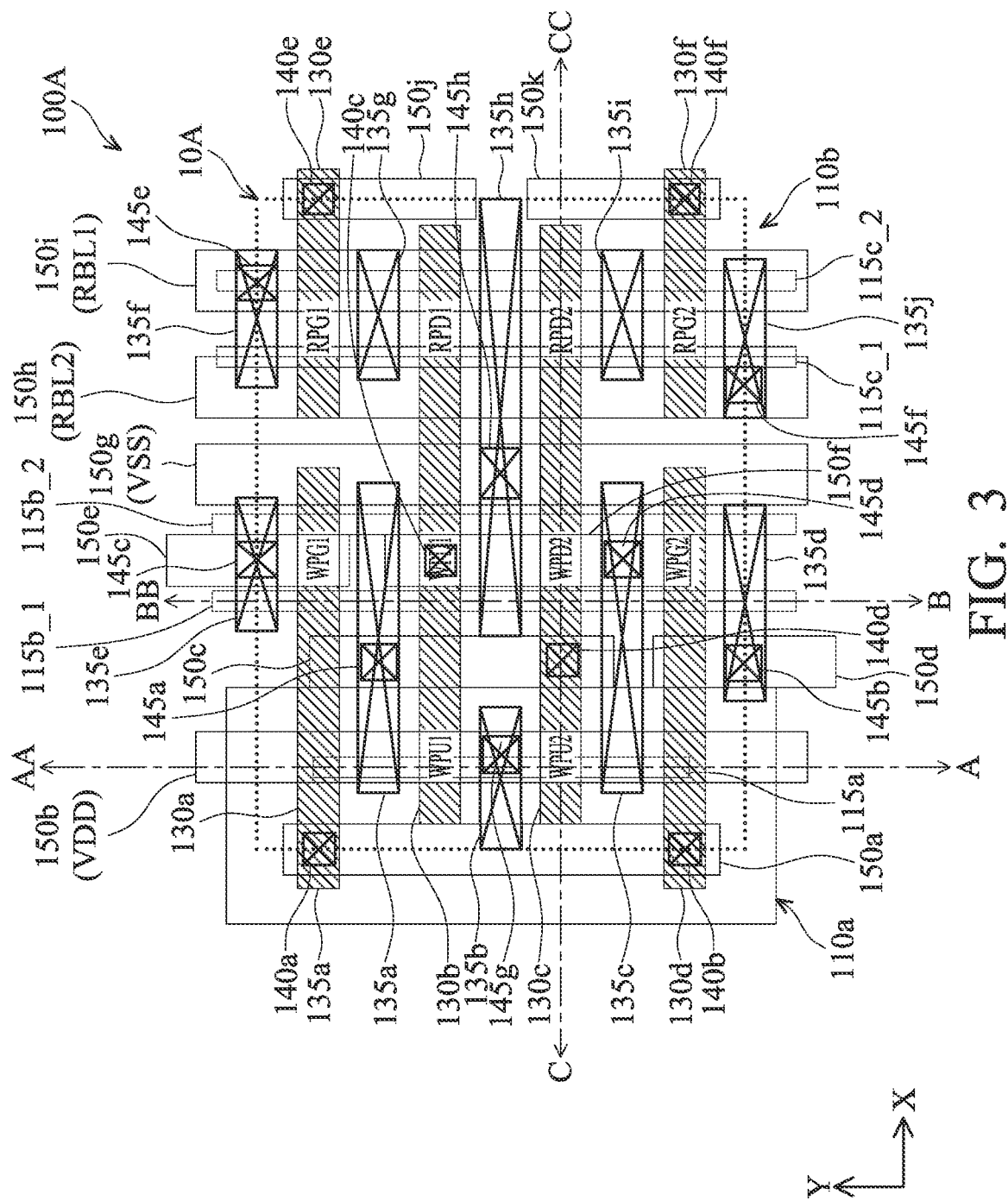
FIG. 3 shows a top view of a memory cell in a semiconductor device, with all the depictions regarding components in and under the first metallization layer of FIG. 2, in accordance with some embodiments of the disclosure.

FIG. 3 shows a top view of a memory cell 10A in a semiconductor device 100A, with all the depictions regarding components in and under the first metallization layer of FIG. 2, in accordance with some embodiments of the disclosure. Moreover, the memory cell 10A is an implementation of the memory cell 10 depicted in FIG. 1. In this embodiment, the transistors in the memory cell 10A are fin-like field effect transistors (FinFETs).

The memory cell 10A includes a substrate (not labeled) having a P-type well region 110b and an N-type well region 110a. The memory cell 10A includes the active structures 115a, 115b_1, 115b_2, 115c_1 and 115c_2 extending along the Y-direction. The active structures 115b_1, 115b_2, 115c_1 and 115c_2 are formed in the P-type well region 110b, and the active structure 115a is formed in the N-type well region 110a. In such embodiments, the active structures 115a, 115b_1, 115b_2, 115c_1 and 115c_2 are the semiconductor fins formed on the substrate. The number of fins for each transistor is provided as an example. In some embodiments, any number of fins are within the scope of various embodiments. In some embodiments, the active structures 115a, 115b_1, 115b_2, 115c_1 and 115c_2 are integrally formed with the substrate.

A gate structure 130b forms the pull-up transistor WPU1 with the underlying active structure 115a in the N-type well region 110a. In this embodiment, the gate structures 115a is fin-based and includes one or more fins. The gate structure 130b further forms the pull-down transistor WPD1 with the underlying active structures 115b_1 and 115b_2 in the P-type well region 110b, and the pull-down transistor RPD1 with the underlying active structures 115c_1 and 115c_2 in the P-type well region 110b. In other words, the gate structure 130b is shared by the pull-up transistor WPU1 and the pull-down transistors WPD1 and RPD1, and the gate structure 130b corresponds to the data node NDB. In some embodiments, each of the active structures 115b_1 and 115b_2 and the active structures 115c_1 and 115c_2 is fin-based and includes one or more fins.

A gate structure 130c forms the pull-up transistor WPU2 with the underlying active structure 115a in the N-type well region 110a. In this embodiment, the active structure 115a is shared by the pull-up transistors WPU1 and WPU2. The gate structure 130c further forms the pull-down transistor WPD2 with the underlying active structures 115b_1 and 115b_2 in the P-type well region 110b, and the pull-down transistor RPD2 with the underlying active structures 115c_1 and 115c_2 in the P-type well region 110b. In other words, the gate structure 130c is shared by the pull-up transistor WPU2 and the pull-down transistors WPD2 and RPD2, and the gate structure 130c corresponds to the data node ND.

A gate structure 130a forms the pass-gate transistor WPG1 with the underlying active structures 115b_1 and 115b_2 in the P-type well region 110b. A gate structure 130d forms the pass-gate transistor WPG2 with the underlying active structures 115b_1 and 115b_2 in the P-type well region 110*b*. In this embodiment, the active structures 115*b*_1 and 115*b*_2 are shared by the pass-gate transistors WPG1 and WPG2, and the pull-down transistors WPD1 and WPD2. Furthermore, the number of the active structures 115*b*_1 and 115*b*_2 shared by the pass-gate transistors WPG1 and WPG2, and the pull-down transistors WPD1 and WPD2 is provided as an example. The gate structure 130*a* is electrically connected to the gate structure 130*d* through the gate via 140*a*, the metal line 150*a* and the gate via 140*b*.

A gate structure 130*e* forms the pass-gate transistor RPG1 with the underlying active structures 115*c*_1 and 115*c*_2 in the P-type well region 110*b*. A gate structure 130*f* forms the pass-gate transistor RPG2 with the underlying active structures 115*c*_1 and 115*c*_2 in the P-type well region 110*b*. In this embodiment, the active structures 115*c*_1 and 115*c*_2 are shared by the pass-gate transistors RPG1 and RPG2, and the pull-down transistors RPD1 and RPD2. In other words, the transistors in the first read port circuit 14 and the second read port circuit 16 share the same active structures. The gate structure 130*e* is electrically connected to the metal line 150*j* through the gate via 140*e*. The gate structure 130*f* is electrically connected to the metal line 150*k* through the gate via 140*f*. Furthermore, the number of the active structures 115*c*_1 and 115*c*_2 shared by the pass-gate transistors RPG1 and RPG2, and the pull-down transistors RPD1 and RPD2 is provided as an example.

In FIG. 3, the source/drain contacts 135*a* through 135*j* extend in the X-direction, and the metal lines 150*a* through 150*k* are formed in the first metallization layer and extend in the Y-direction.

The source/drain contacts 135*a* and 135*b* overlap the active structure 115*a* and correspond to source and drain of the pull-up transistor WPU1. Furthermore, the source/drain contacts 135*b* and 135*c* overlap the active structure 115*a* and correspond to source and drain of the pull-up transistor WPU2. The source/drain contact 135*b* is electrically connected to the metal line 150*b* through the via 145*g*. The source/drain contact 135*a* is electrically connected to the gate structure 130*c* through the via 145*a*, the metal line 150*c*, and the gate via 140*d* in sequence. The source/drain contact 135*c* is electrically connected to the gate structure 130*b* through the via 145*d*, the metal line 150*f*, and the gate via 140*c* in sequence.

The source/drain contacts 135*e* and 135*a* overlap the active structures 115*b*_1 and 115*b*_2 and correspond to source and drain of the pass-gate transistor WPG1. The source/drain contact 135*e* is electrically connected to the metal line 150*e* through the via 145*c*. Furthermore, the source/drain contacts 135*a* and 135*h* overlap the active structures 115*b*_1 and 115*b*_2 and correspond to source and drain of the pull-down transistor WPD1. The source/drain contact 135*a* is shared by the pull-up transistor WPU1, the pass-gate transistor WPG1, and the pull-down transistor WPD1. The source/drain contact 135*h* is electrically connected to the metal line 150*g* through the via 145*h*.

The source/drain contacts 135*h* and 135*c* overlap the active structures 115*b*_1 and 115*b*_2 and correspond to source and drain of the pull-down transistor WPD2. The source/drain contact 135*c* is shared by the pull-up transistor WPU2, the pass-gate transistor WPG2, and the pull-down transistor WPD2. Furthermore, the source/drain contacts 135*c* and 135*d* overlap the active structures 115*b*_1 and 115*b*_2 and correspond to source and drain of the pass-gate transistor WPG2. The source/drain contact 135*d* is electrically connected to the metal line 150*d* through the via 145*b*.

The source/drain contacts 135*f* and 135*g* overlap the active structures 115*c*_1 and 115*c*_2 and correspond to source and drain of the pass-gate transistor RPG1. The source/drain contact 135*f* is electrically connected to the metal line 150*i* through the via 145*e*. Furthermore, the source/drain contacts 135*g* and 135*h* overlap the active structures 115*c*_1 and 115*c*_2 and correspond to source and drain of the pull-down transistor RPD1. The source/drain contact 135*g* is shared by the pass-gate transistor RPG1 and the pull-down transistor RPD1.

The source/drain contacts 135*h* and 135*i* overlap the active structures 115*c*_1 and 115*c*_2 and correspond to source and drain of the pull-down transistor RPD2. The source/drain contact 135*h* is a longer contact shared by the pull-down transistors RPD1 and RPD2, and the pull-down transistors WPD1 and WPD2. Furthermore, the source/drain contacts 135*i* and 135*j* overlap the active structures 115*c*_1 and 115*c*_2 and correspond to source and drain of the pass-gate transistor RPG2. The source/drain contact 135*j* is electrically connected to the metal line 150*h* through the via 145*f*. The source/drain contact 135*i* is shared by the pass-gate transistor RPG2 and the pull-down transistor RPD2.

The metal lines 150*a* through 150*k* are formed in the first metallization layer that is the lowest level metallization layer. The metal line 150*i* functions as the first read bit line RBL1, and the metal line 150*h* functions as the second read bit line RBL2 for the memory cell 10A. In some embodiments, the memory cells 10A arranged in the same column of the memory array share the same first read bit line RBL1 through the metal line 150*i* and the same second read bit line RBL2 through the metal line 150*h*.

The metal line 150*b* functions as the VDD conductor and the metal line 150*g* functions as the VSS conductor for the memory cell 10A. In this embodiment, the VSS conductor is adjacent the second read bit line RBL2, and is disposed between the VDD conductor and the second read bit line RBL2. In some embodiments, the memory cells 10A arranged in the same column of the memory array share the same VDD conductor through the metal line 150*b* and the same VSS conductor through the metal line 150*g*.

The metal line 150*a* functions as a landing pad for the write word line WWL. The metal line 150*d* functions as a landing pad for the write bit line WBL, and the metal line 150*e* functions as a landing pad for the write bit line WBLB. The metal line 150*j* functions as a landing pad for the first read word line RWL1, and the metal line 150*k* functions as a landing pad for the second read word line RWL2.

The memory cell 10A has a cell width of X1 measured along the X-direction and a cell height of Y1 measured along the Y-direction. In such embodiments, the cell width X1 is greater than the cell height Y1. In some embodiments, a memory macro is formed but repeating and abutting memory cells having a configuration identical or mirrored-identical to the memory cell 10A. Thus, the cell width X1 is also referred to as a cell pitch along the X-direction, and the cell height Y1 is also referred to as a cell pitch along the Y-direction.

Figure 4A:
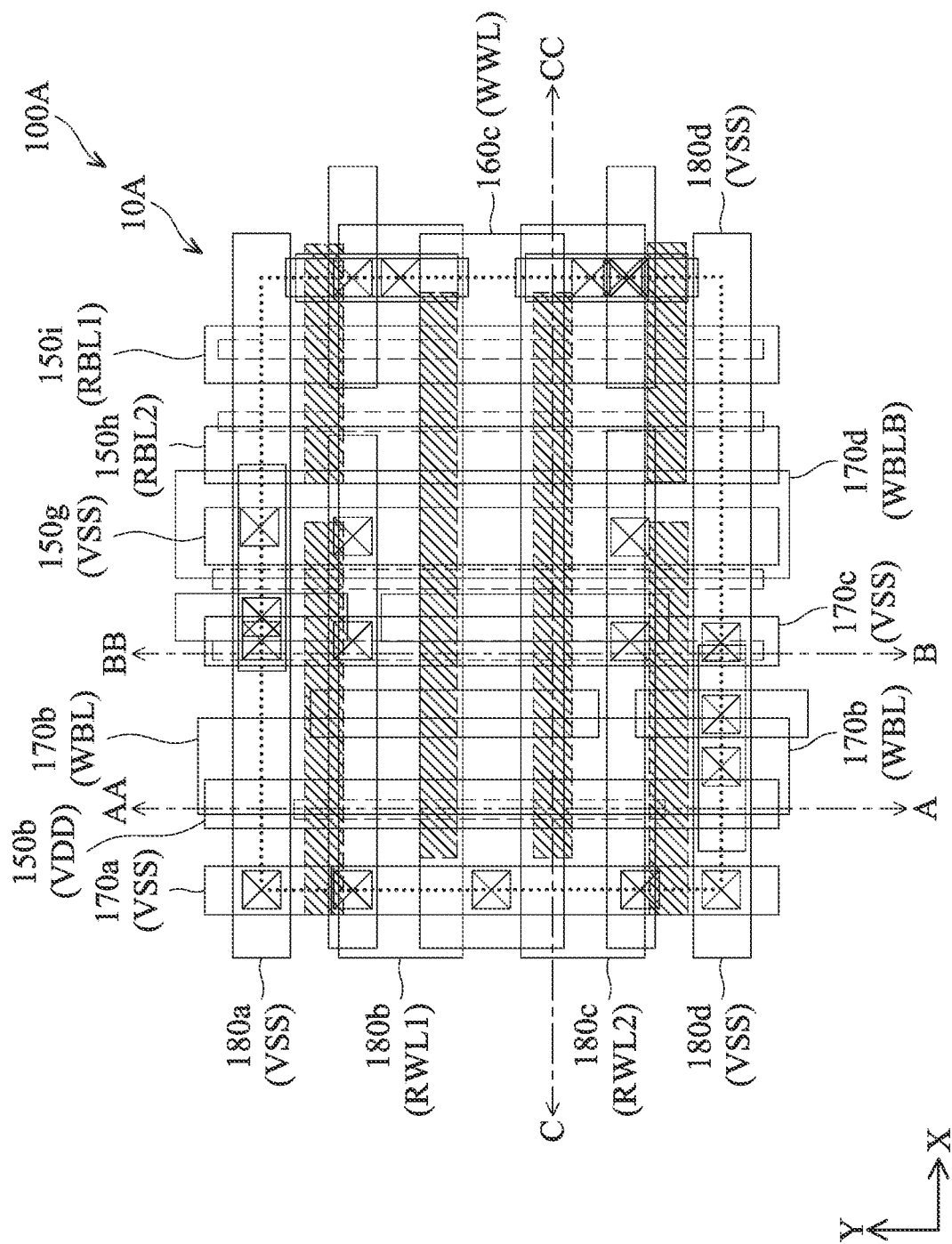
FIG. 4A shows a top view of the memory cell of FIG. 3, with all the depictions regarding components over the first metallization layer, in accordance with some embodiments of the disclosure.
Figure 4B:
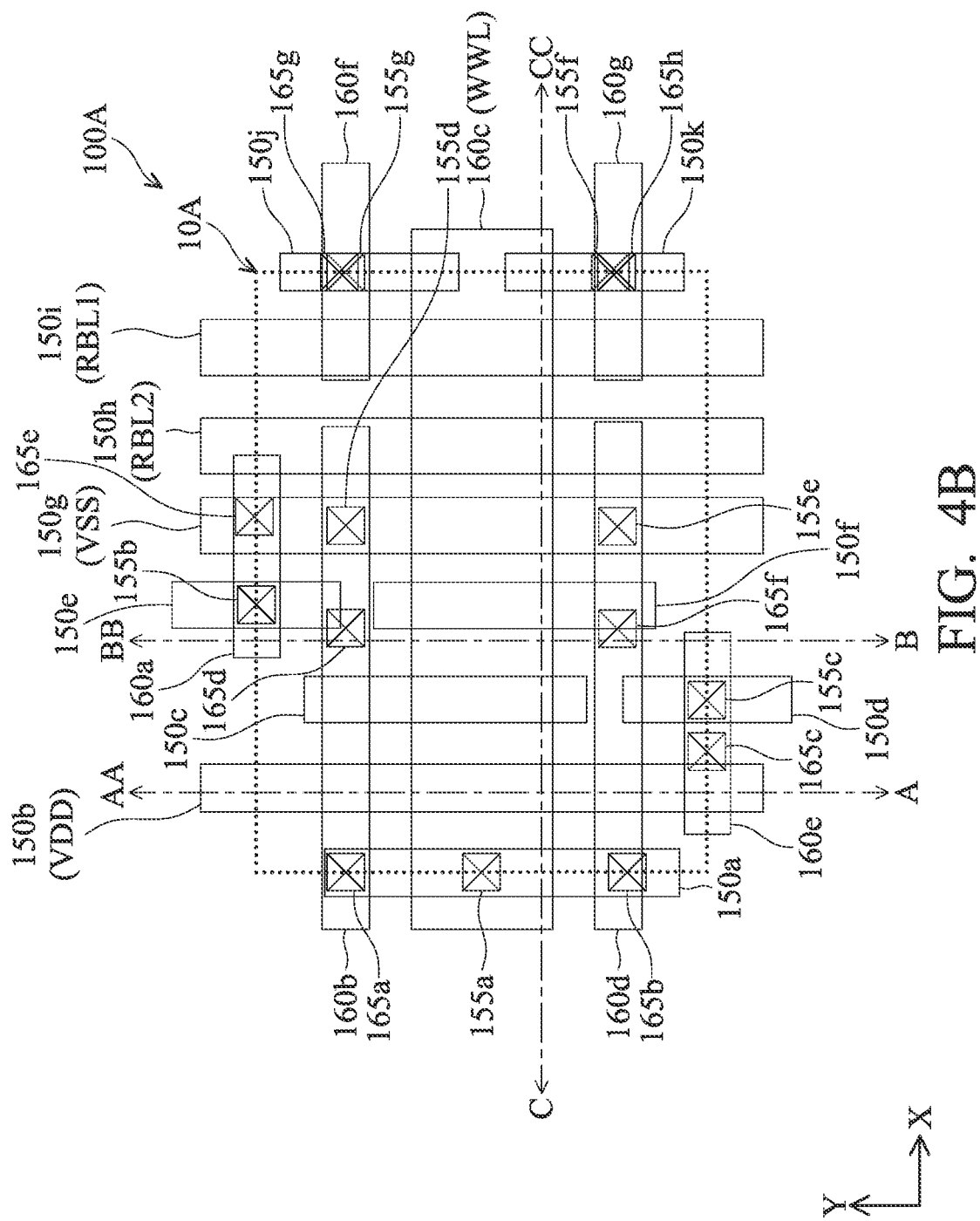
FIG. 4B shows a top view of the memory cell of FIG. 4A, with all the depictions regarding components under the third metallization layer.

FIG. 4A shows a top view of the memory cell 10A of FIG. 3, with all the depictions regarding components over the first metallization layer, in accordance with some embodiments of the disclosure. FIG. 4B shows a top view of the memory cell 10A of FIG. 4A, with all the depictions regarding components under the third metallization layer, and FIG. 4C shows a top view of the memory cell 10A of FIG. 4A, with all the depictions regarding components over the second metallization layer.

Figure 4C:
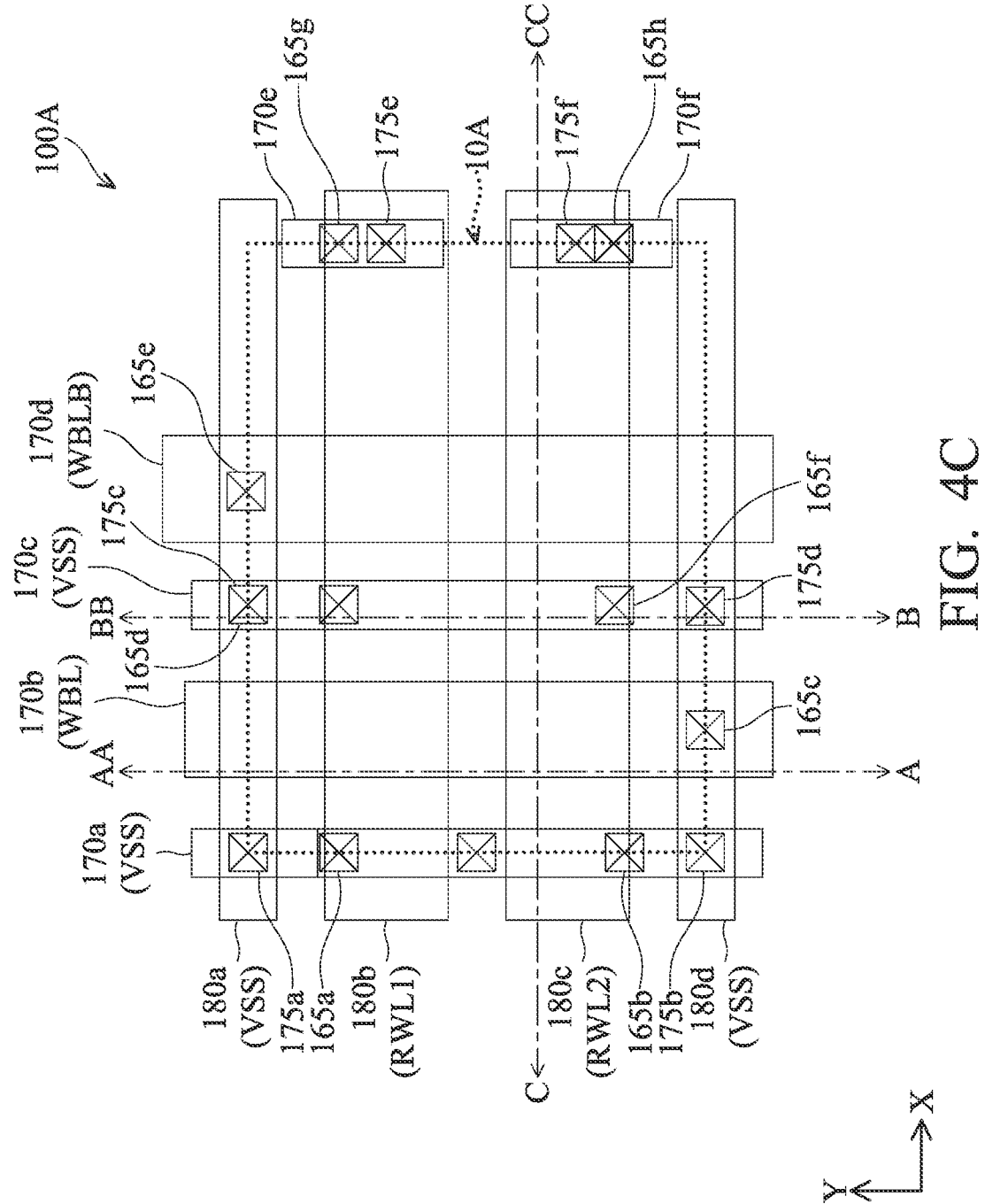
FIG. 4C shows a top view of the memory cell of FIG. 4A, with all the depictions regarding components over the second metallization layer.

In FIGS. 4A through 4C, the same components in memory cell 10A are given the same reference numbers, and a detailed description thereof is thus omitted. Some components of memory cell 10A of FIGS. 4A through 4C that are the same to those in the memory cell 10A of FIG. 3 may be omitted, or depicted in dotted lines, or not labeled for clarity.

In FIG. 4B, the metal lines 160a through 160g are formed in the second metallization layer and extend in the X-direction. The metal line 160c is wider than the metal lines 160a, 160b, 160d through 160g. The vias 155a through 155g are formed in the first via layer between the first and second metallization layers. The vias 165a through 165h are formed in the second via layer over the second metallization layer.

The metal line 150a is electrically connected to the metal line 160c through the via 155a. The metal line 160c functions as the write word line WWL for the memory cell 10A. Moreover, the write word line WWL has lower metal resistance due to wider metal width. In some embodiments, the memory cells 10A arranged in the same row of the memory array share the same write word line WWL through the metal line 160c.

The metal line 160b is electrically connected to the metal line 150g (VSS conductor) through the via 155d, and the metal line 160d is electrically connected to the metal line 150g (VSS conductor) through the via 155e. The metal line 160a is electrically connected to the metal line 150e through the via 155b. In this embodiment, the metal line 160a functions as a landing pad for the write bit line WBLB. The metal line 160e is electrically connected to the metal line 150d through the via 155c. In this embodiment, the metal line 160e functions as a landing pad for the write bit line WBL. The metal line 160g is electrically connected to the metal line 150k through the via 155f. The metal line 160f is electrically connected to the metal line 150j through the via 155g. The metal line 160f functions as a landing pad for the first read word line RWL1, and the metal line 160g functions as a landing pad for the second read word line RWL2.

In FIG. 4C, the metal lines 170a through 160f are formed in the third metallization layer and extend in the Y-direction. The metal lines 170b and 170d are wider than the metal lines 170a, 170c, 170e and 170f. The vias 165a through 165h are formed in the second via layer between the second and third metallization layers. The metal lines 180a through 180d are formed in the fourth metallization layer and extend in the X-direction. The vias 175a through 175f are formed in the third via layer between the third and fourth metallization layers.

The metal line 170a is electrically connected to the metal lines 160b and 160d of FIG. 4B through the vias 165a and 165b, respectively. Moreover, the metal line 170a is further electrically connected to the metal lines 180a and 180d through the vias 175a and 175b, respectively. The metal line 170b is electrically connected to the metal line 160e of FIG. 4B through the via 165c. The metal line 170b functions as the write bit line WBL for the memory cell 10A. Moreover, the write bit line WBL has lower metal resistance due to wider metal width. In some embodiments, the memory cells 10A arranged in the same column of the memory array share the same write bit line WBL through the metal line 170b.

The metal line 170c is electrically connected to the metal lines 160b and 160d of FIG. 4B through the vias 165d and 165f, respectively. Moreover, the metal line 170c is further electrically connected to the metal lines 180a and 180d through the vias 175c and 175d, respectively. The metal line 170d is electrically connected to the metal line 160a of FIG. 4B through the via 165e. The metal line 170d functions as the write bit line WBLB for the memory cell 10A. Moreover, the write bit line WBLB has lower metal resistance due to wider metal width. In some embodiments, the memory cells 10A arranged in the same column of the memory array share the same write bit line WBLB through the metal line 170d.

The metal lines 170a and 170c function as the VSS conductors for the memory cell 10A. In the third metal line layer, the write bit line WBL (i.e., the metal line 170b) is disposed between the two VSS conductors (i.e., the metal lines 170a and 170c). Moreover, the write bit line WBL (i.e., the metal line 170b) is separated from the write bit line WBLB (i.e., the metal line 170d) by the VSS conductor (i.e., the metal line 170c). In other words, the metal line 170c is disposed between the metal lines 170b and 170d.

The metal line 170e is electrically connected to the metal line 160f of FIG. 4B through the via 165g. Moreover, the metal line 170e is further electrically connected to the metal line 180b through the via 175e. The metal line 180b functions as the first read word line RWL1 for the memory cell 10A. In some embodiments, the memory cells 10A arranged in the same row of the memory array share the same first read word line RWL1 through the metal line 180b.

The metal line 170f is electrically connected to the metal line 160g of FIG. 4B through the via 165h. Moreover, the metal line 170f is further electrically connected to the metal line 180c through the via 175f. The metal line 180c functions as the second read word line RWL2 for the memory cell 10A. In some embodiments, the memory cells 10A arranged in the same row of the memory array share the same second read word line RWL2 through the metal line 180c.

The metal lines 180a and 180d function as the VSS conductors for the memory cell 10A. In the fourth metal line layer, the first read word line RWL1 (i.e., the metal line 180b) and the second read word line RWL2 (i.e., the metal line 180c) are disposed between the two VSS conductors (i.e., the metal lines 180a and 180d). In other words, the first read word line RWL1 and the second read word line RWL2 are surrounded by the two VSS conductors.

In the interconnect structure of the memory cell 10A, the vias and metal lines corresponding to the supply voltage VDD form a VDD power mesh in the semiconductor device 100A. Moreover, the vias and metal lines corresponding to the ground VSS form a VSS power mesh in the semiconductor device 100A.

In SRAM application, the cell structure of the memory cell 10A can meet both high density (i.e., fewer active structure regions and fewer metal lines in each layer) and high speed (lower RC delay for both bit lines and word lines of read and write ports). Furthermore, the first read bit line RBL1 and the second read bit line RBL2 are arranged in the lowest metallization layer, thus decreasing the capacitance of the first read bit line RBL1 and the second read bit line RBL2, so as to increase the read port speed. On the other hand, the write bit lines WBL and WBLB are arranged in the higher metallization layer to obtain lower resistance, so as to improve the write margin for the memory cell 10A. In general, the write margin is dominated by cell device setting (e.g., the ratio of turned-on current of the write pass-gate transistor to the write pull-up transistor) and the write bit-line resistance.

Figure 5A:
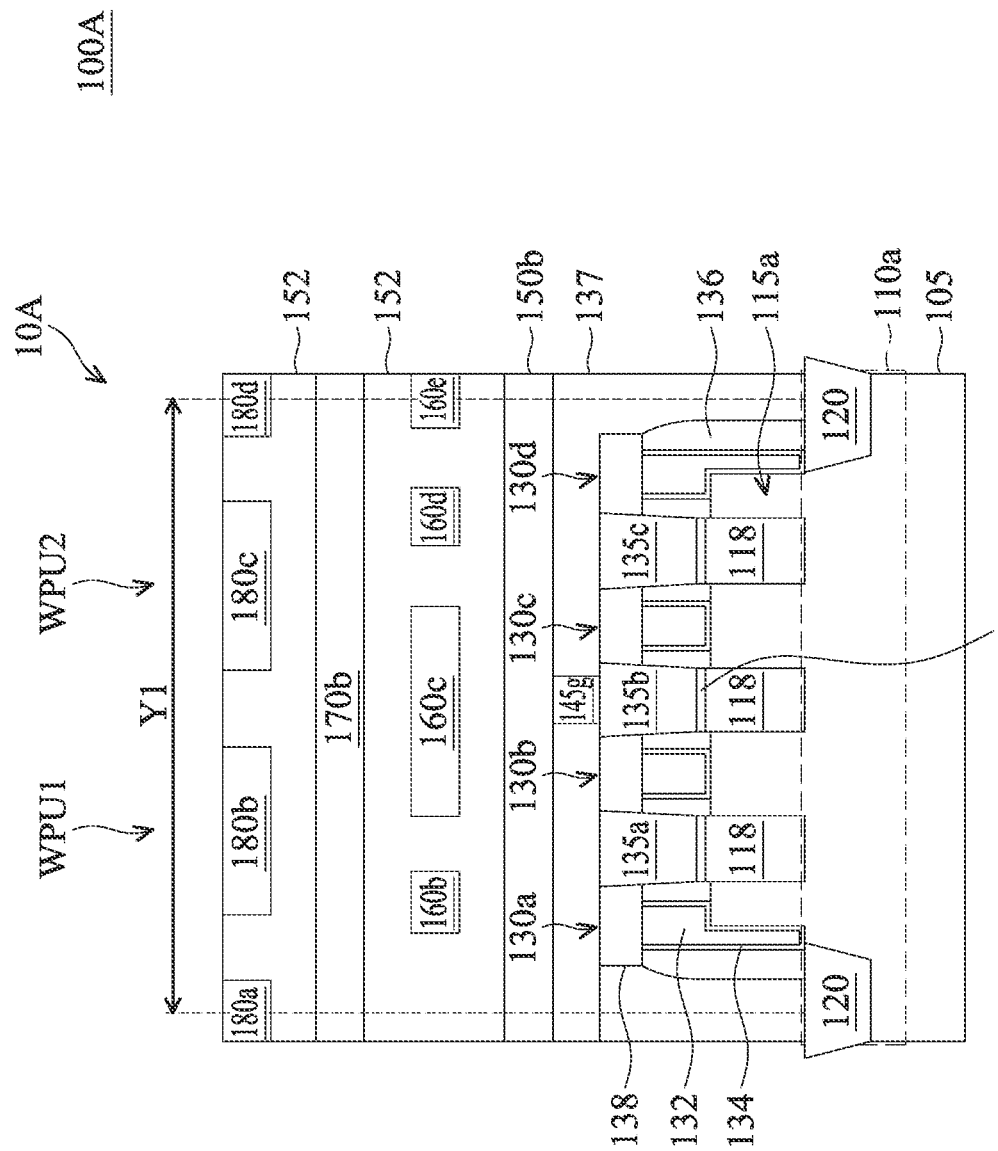
FIG. 5A shows a cross sectional view of the semiconductor device along a line A-AA in FIGS. 3 and 4A through 4C, in accordance with some embodiments of the disclosure.

FIG. 5A shows a cross sectional view of the semiconductor device 100A along a line A-AA in FIGS. 3 and 4A through 4C, in accordance with some embodiments of the disclosure. As described above, the memory cell 10A has a cell height (or cell pitch) of Y1 measured along the Y-direction. In FIG. 5A, the cross sectional view of the pull-up transistors WPU1 and WPU2 are illustrated, and the pull-up transistors WPU1 and WPU2 are P-type Fin FETs. In this embodiment, the cell height Y1 is the same as 4 times the contacted poly pitch (CPP), i.e., 4 times the gate pitch for the gate structures 130a through 130f.

The N-type well region 110a is formed over the substrate 105. The substrate 105 may contains a semiconductor material, such as bulk silicon (Si). In some other embodiments, the substrate 105 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 105 may also include an insulating layer, such as a silicon oxide layer, to have a silicon-on-insulator (SOI) structure or a germanium-on-insulator (GOI) structure. The isolation feature 120 is over the N-type well region 110a.

The active structure 115a is formed in the N-type well region 110a. In some embodiments, the source/drain feature 118 is a source/drain region formed by the epitaxially-grown material. In some embodiments, for an N-type transistor, the epitaxially-grown materials may include SiP, SiC, SiPC, SiAs, Si, or a combination thereof. In some embodiments, for a P-type transistor, the epitaxially-grown materials may include SiGe, SiGeC, Ge, Si, a boron-doped SiGe, boron and carbon doped SiGe, or a combination thereof. Source/drain region(s) may refer to a source or a drain, individually or collectively dependent upon the context.

The silicide features 121 is formed between the source/drain contacts 135a through 135c and the source/drain features 118. The silicide features 121 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

In the memory cell 10A, each of the gate structures 130a through 130f includes the gate feature (e.g., gate electrode) 132, the gate dielectric layer 134, the gate spacer 136 and the gate top dielectric layer 138. In some embodiments, the gate feature 132 may include polysilicon or work function metal. The work function metal includes TiN, TaN, TiAl, TiAlN, TaAl, TaAlN, TaAlC, TaCN, WNC, Co, Ni, Pt, W, combinations thereof, or other suitable material.

In some embodiments, the gate feature 132 may include a capping layer, a barrier layer, an n-type work function metallization layer, a p-type work function metallization layer, and a fill material (not shown). In some embodiments, the P-type transistors and the N-type transistors are formed by the same work function material. In some embodiments, the P-type transistors and the N-type transistors are made of different work function materials.

The gate dielectric layer 134 may include dielectric materials, such as silicon oxide, silicon nitride, silicon oxynitride, dielectric material(s) with high dielectric constant (high-k), or a combination thereof. Examples of high-k dielectric materials include $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material.

The gate spacers 136 are on sidewalls of the gate dielectric layer 134. The gate spacers 136 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 136 may include a single layer or a multi-layer structure.

The gate top dielectric layer 138 is over the gate dielectric layer 134 and the gate feature 132. The gate top dielectric layer 138 is used for contact etch protection layer. The material of gate top dielectric layer 138 is selected from a group consisting of oxide, SiOC, SiON, SiOCN, nitride base dielectric, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), combinations thereof, or other suitable material.

The via 145g is formed in the inter-layer dielectric (ILD) 137, and the metal line 150b is electrically connected to the source/drain contact 135b of the pull-up transistors WPU1 and WPU2 through the via 145g. The metal lines formed in the first through fourth metallization layers and the vias formed in the first through three via layers are formed in an inter-metal dielectric (IMD) 152. In this embodiment, the metal line 160c is formed over the via 145g and is electrically separated from the via 145g. In such embodiments, metal line 150b extends in the Y-direction and overlaps the pull-up transistors WPU1 and WPU2.

Figure 5B:
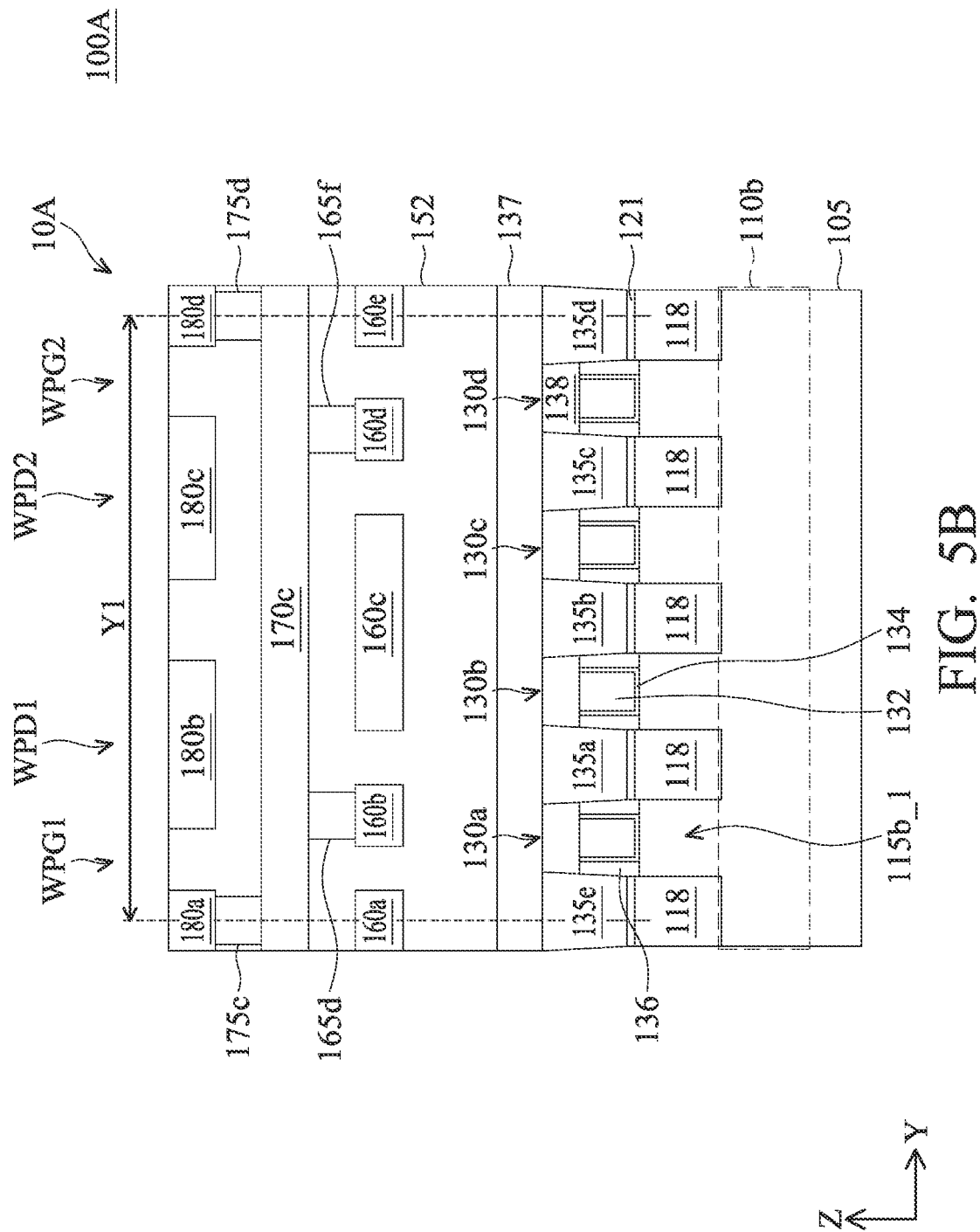
FIG. 5B shows a cross sectional view of the semiconductor device along a line B-BB in FIGS. 3 and 4A through 4C, in accordance with some embodiments of the disclosure.

FIG. 5B shows a cross sectional view of the semiconductor device 100A along a line B-BB in FIGS. 3 and 4A through 4C, in accordance with some embodiments of the disclosure. As described above, the memory cell 10A has a cell height (or cell pitch) of Y1 measured along the Y-direction. In FIG. 5B, the cross sectional view of the pull-down transistors WPD1 and WPD2 and the pass-gate transistors WPG1 and WPG2 are illustrated, and the pull-down transistors WPD1 and WPD2 and the pass-gate transistors WPG1 and WPG2 are N-type transistors.

The P-type well region 110b is formed over the substrate 105. The active structure 115b_1 is formed in the P-type well region 110b. The gate structures 130a through 130d are formed over the active structure 115b_1.

The metal line 170c extends in the Y-direction and overlaps the pull-down transistors WPD1 and WPD2 and the pass-gate transistors WPG1 and WPG2. In this embodiment, the metal line 170 is electrically connected to the metal lines 180a and 180d through the vias 175c and 175d, respectively. Furthermore, the metal line 170 is further electrically connected to the metal lines 160b and 160d through the via 165d and 165f, respectively.

Figure 5C:
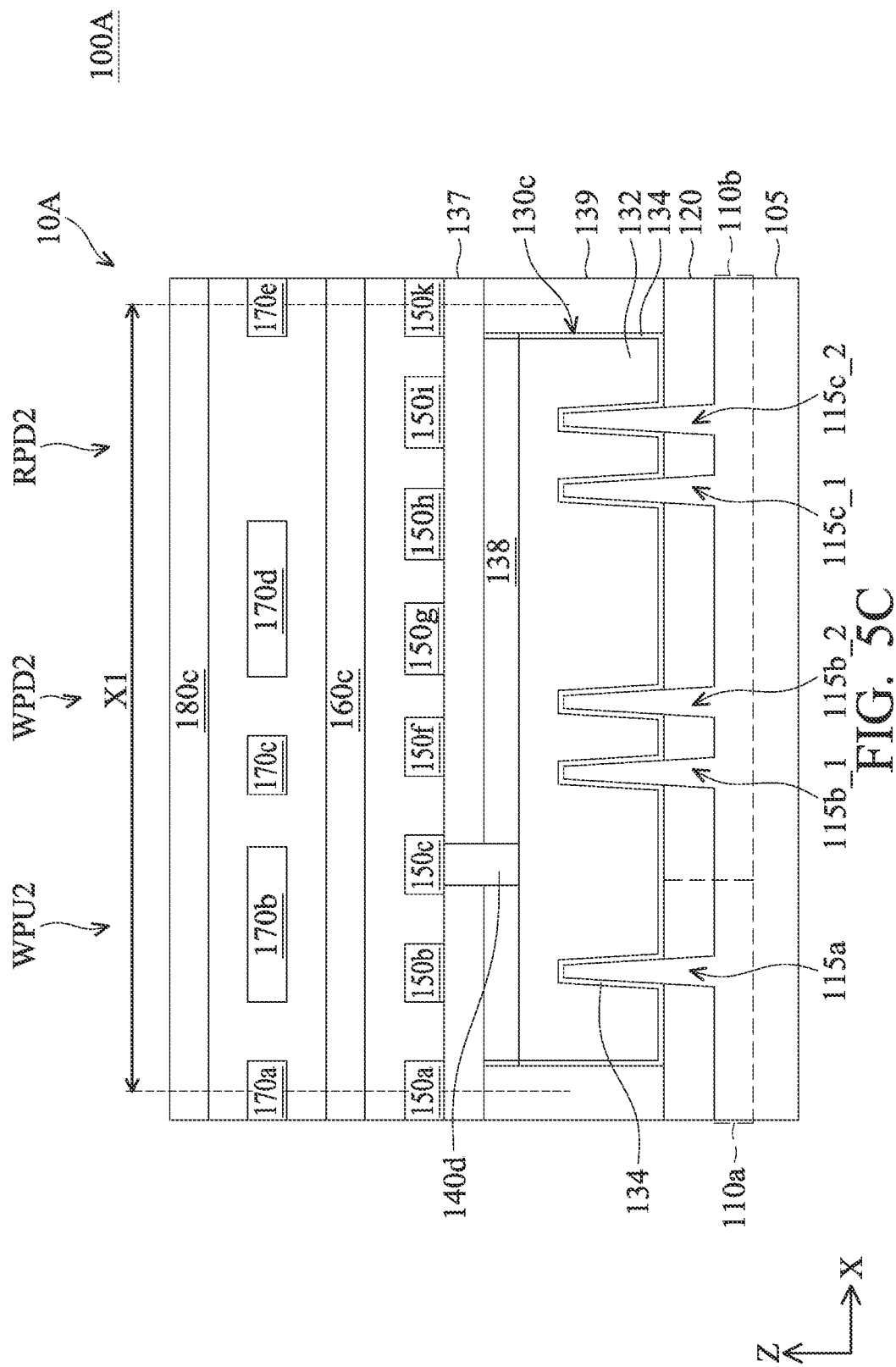
FIG. 5C shows a cross sectional view of the semiconductor device along a line C-CC in FIGS. 3 and 4A through 4C, in accordance with some embodiments of the disclosure.

FIG. 5C shows a cross sectional view of the semiconductor device 100A along a line C-CC in FIGS. 3 and 4A through 4C, in accordance with some embodiments of the disclosure. As described above, the memory cell 10A has a cell width (or cell pitch) of X1 measured along the X-direction. In FIG. 5C, the cross sectional view of the pull-up transistor WPU1, and the pull-down transistors WPD1 and RPD2 are illustrated, and the pull-down transistors WPD1 and RPD2 are N-type transistors and the pull-up transistor WPU1 is P-type transistor. In the X-direction, less active structures (lower down to 3) are used in the memory cell 10A, thereby having highly capability for cell scaling.

The P-type well region 110b and the N-type well region 110a are formed over the substrate 105. The active structure 115a is formed on the N-type well region 110a, and the active structures 115b_1 and 115b_2 and the active structures 115c_1 and 115c_2 are formed on the P-type well region 110b. The active structures 115a, 115b_1, 115b_2, 115c_1 and 115c_2 are separated from each other by the isolation feature 120 (e.g., the STI).

The gate feature 132 is formed over the gate dielectric layer 134 and is positioned over a top surface of the active structures 115a, 115b_1, 115b_2, 115c_1 and 115c_2. Moreover, the gate end dielectrics 139 are formed on opposite sides of the gate feature 132. The active structures 115a overlapping the gate feature 132 may serve as a channel region of the pull-up transistor WPU2. Each of the active structures 115b_1 and 115b_2 overlapping the gate feature 132 may serve as a channel region of the pull-down transistor WPD2. Furthermore, each of the active structures 115c_1 and 115c_2 overlapping the gate feature 132 may serve as a channel region of the pull-down transistor WRD2. In some embodiments, the gate feature 132 is made of conductive material, such as aluminum (Al), copper (Cu), tungsten (W), titanium (Ti), tantalum (Ta), or other applicable materials.

The gate dielectric layer 134 may be a single layer or multiple layers. The gate top dielectric layer 138 is over the gate dielectric layer 134 and the gate feature 132.

The gate dielectric layer 134 is made of silicon oxide (SiOx), silicon nitride (SixNy), silicon oxynitride (SiON), dielectric material(s) with high dielectric constant (high-k), or a combination thereof. In some embodiments, the gate dielectric layer 134 is deposited by a plasma enhanced chemical vapor deposition (PECVD) process or by a spin coating process. The high dielectric constant (high-k) material may be hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material.

The gate via 140d is formed over the gate feature 132 and extends through the top dielectric layer 138 and the ILD 137. The gate feature 132 is electrically connected to the metal line 150c through the gate via 140d. In such embodiments, the metal line 160c extends in the X-direction and overlaps the pull-up transistor WPU2 and the pull-down transistors WPD2 and RPD2. Furthermore, the metal line 180c also extends in the X-direction and overlaps the pull-up transistor WPU2 and the pull-down transistors WPD2 and RPD2.

Figure 6:
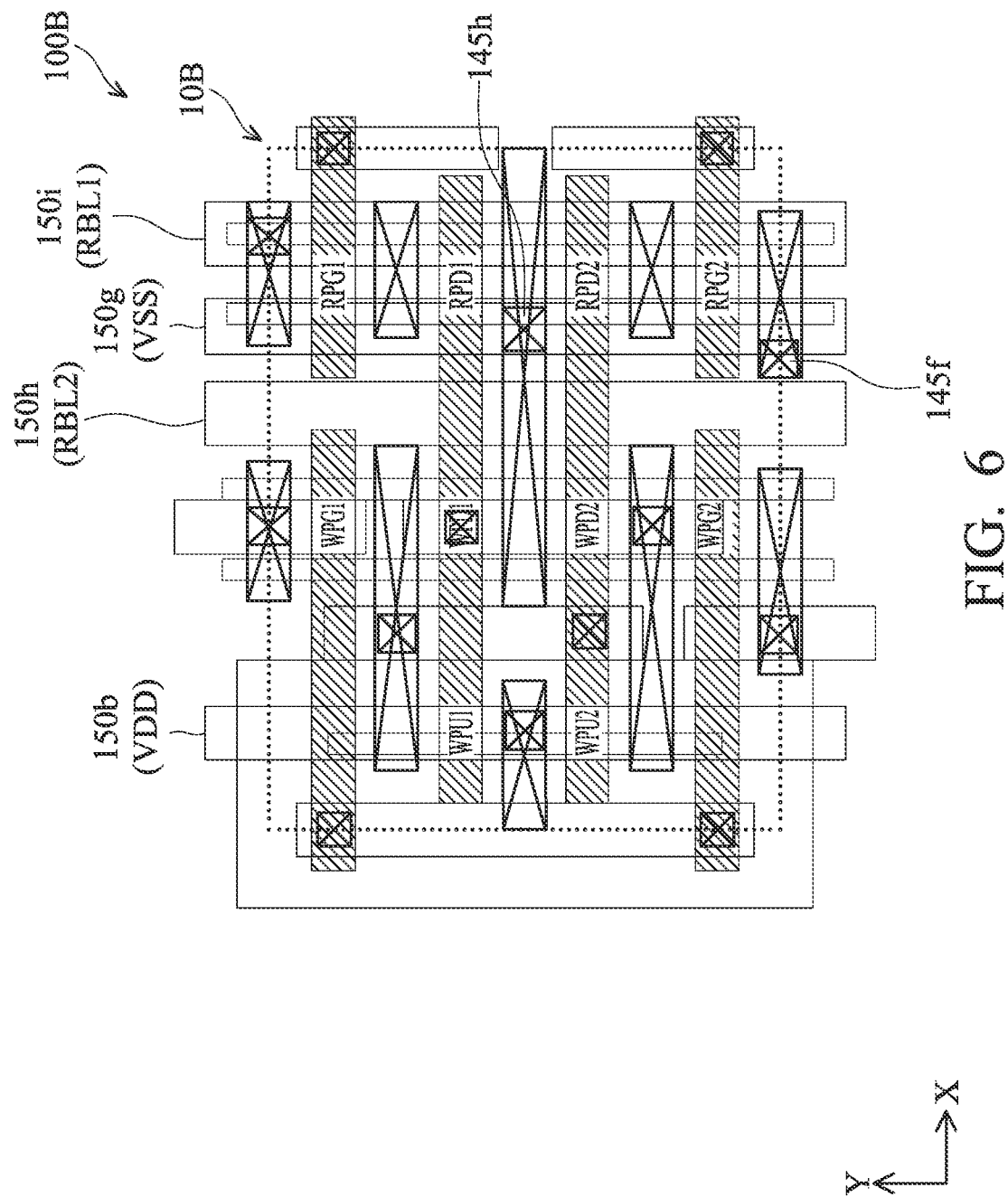
FIG. 6 shows is a top view of a memory cell in a semiconductor device 100B, with all the depictions regarding components in and under the first metallization layer of FIG. 2, in accordance with some embodiments of the disclosure.

FIG. 6 shows a top view of a memory cell 10B in a semiconductor device 100B, with all the depictions regarding components in and under the first metallization layer of FIG. 2, in accordance with some embodiments of the disclosure. Components in the memory cell 10B that are the same or similar to those in the memory cell 10A are given the same reference numbers, and a detailed description thereof is thus omitted. Some components of the memory cell 10B that are the same or similar to those in the memory cell 10A are not labeled for clarity. Moreover, the memory cell 10B is an implementation of the memory cell 10 depicted in FIG. 1.

The configuration of the memory cell 10B is similar to the configuration of the memory cell 10A in FIG. 3, and the differences between the memory cell 10B of FIG. 6 and the memory cell 10A of FIG. 3 is that the positions of the metal lines 150g and 150h are interchanged, and the corresponding vias 145h and 145f are also moved. Furthermore, the corresponding vias connected to the upper metal lines, such as the vias 155d and 155e in FIG. 4B, are also moved. Therefore, the second read bit line RBL2 (i.e., the metal line 150h) is disposed between the VDD conductor (i.e., the metal line 150b) and the VSS conductor (i.e., the metal line 150g). Furthermore, the VSS conductor (i.e., the metal line 150g) is disposed between the second read bit line RBL2 (i.e., the metal line 150h) and the first read bit line RBL1 (i.e., the metal line 150i).

Figure 7:
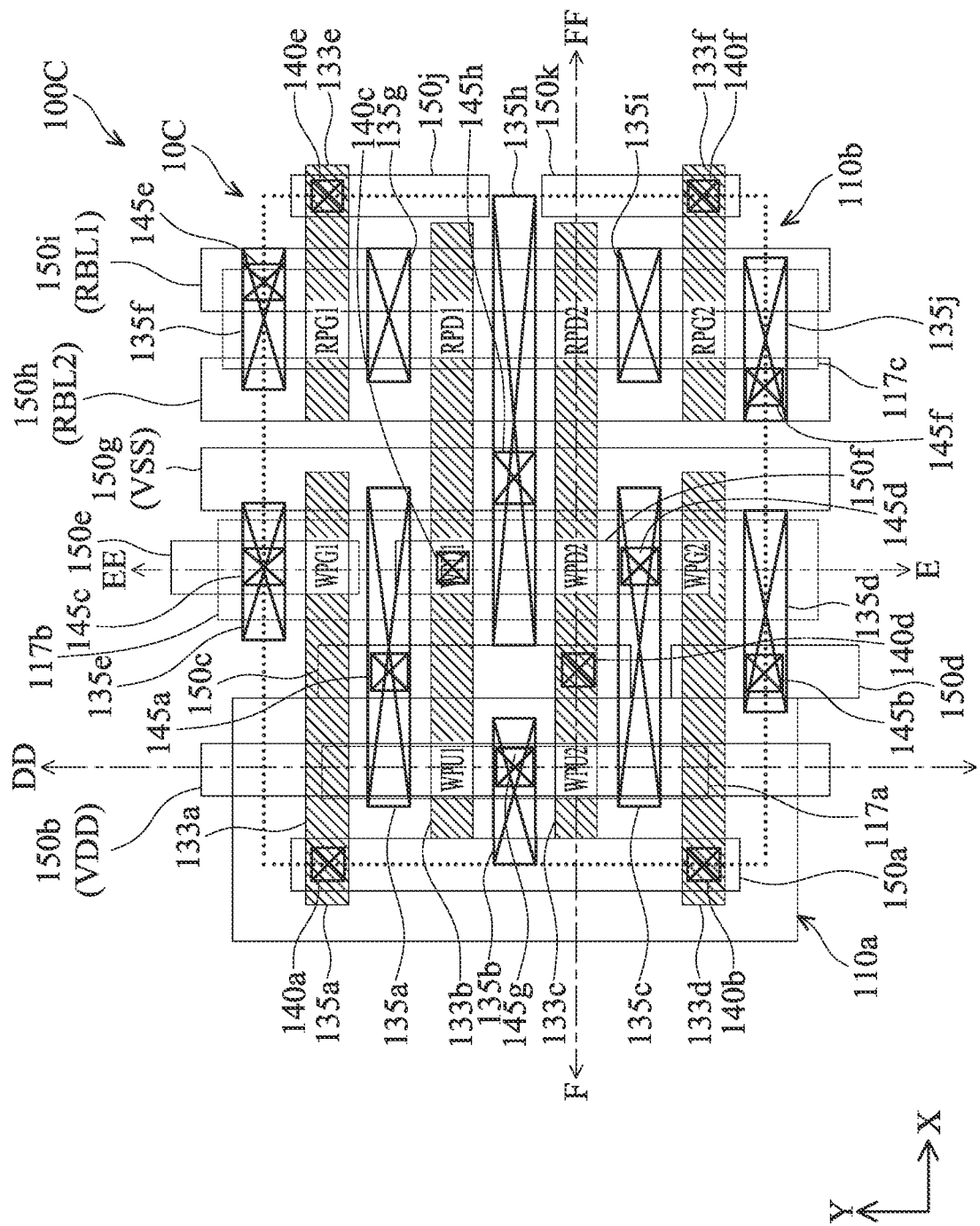
FIG. 7 shows is a top view of a memory cell in a semiconductor device 100C, with all the depictions regarding components in and under the first metallization layer of FIG. 2, in accordance with some embodiments of the disclosure.

FIG. 7 shows is a top view of a memory cell 10C in a semiconductor device 100C, with all the depictions regarding components in and under the first metallization layer of FIG. 2, in accordance with some embodiments of the disclosure. Components in the memory cell 10C that are the same or similar to those in the memory cell 10A are given the same reference numbers, and a detailed description thereof is thus omitted. Some components of the memory cell 10C that are the same or similar to those in the memory cell 10A are not labeled for clarity. Moreover, the memory cell 10C is an implementation of the memory cell 10 depicted in FIG. 1. In this embodiment, the transistors in the memory cell 10C are gate-all-around field effect transistors (GAA FETs).

The configuration of the memory cell 10C is similar to the configuration of the memory cell 10A in FIG. 3, and the differences between the memory cell 10C of FIG. 7 and the memory cell 10A of FIG. 3 is that the memory cell 10C includes the active structures 117a through 117c extending along the Y-direction.

The active structures 117b and 117c are formed in the P-type well region 110b, and the active structure 117a is formed in the N-type well region 110a. In such embodiments, the active structures 117a through 117c are the nanostructures formed on the substrate.

In some embodiments, the nanostructures may also be referred to as channels, channel layers, nanosheets, or nanowires. The nanostructures may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures include silicon for N-type GAA transistors. In other embodiments, the nanostructures include silicon germanium for P-type GAA transistors. In some embodiments, the nanostructures are all made of silicon, and the type of GAA transistors depend on work function metallization layer wrapping around the nanostructures.

The gate structure 133a engages the active structure 117b to form the pass-gate transistor WPG1. The gate structure 133b engages the active structures 117a, 117b and 117c to form the pull-up transistor WPU1 and the pull-down transistors WPD1 and RPD1, respectively. The gate structure 133c engages the active structures 117a, 117b and 117c to form the pull-up transistor WPU2 and the pull-down transistors WPD2 and RPD2, respectively. The gate structure 133d engages the active structure 117b to form the pass-gate transistor WPG2. The gate structure 133e engages the active structure 117c to form the pass-gate transistor RPG1. The gate structure 133f engages the active structure 117c to form the pass-gate transistor RPG2.

The memory cell 10C has a cell width of X2 measured along the X-direction and a cell height of Y2 measured along the Y-direction. In some embodiments, a memory macro is formed but repeating and abutting memory cells having a configuration identical or mirrored-identical to the memory cell 10C. Thus, the cell width X2 is also referred to as a cell pitch along the X-direction, and the cell height Y2 is also referred to as a cell pitch along the Y-direction. In some embodiments, the cell height Y2 of the memory cell 10C is equal to the cell height Y1 of the memory cell 10A, and the cell width X2 of the memory cell 10C is equal to the cell width X1 of the memory cell 10A. In this embodiment, the cell height Y2 is the same as 4 times the contacted poly pitch (CPP), i.e., 4 times the gate pitch for the gate structures 133a through 133f.

Figure 8:
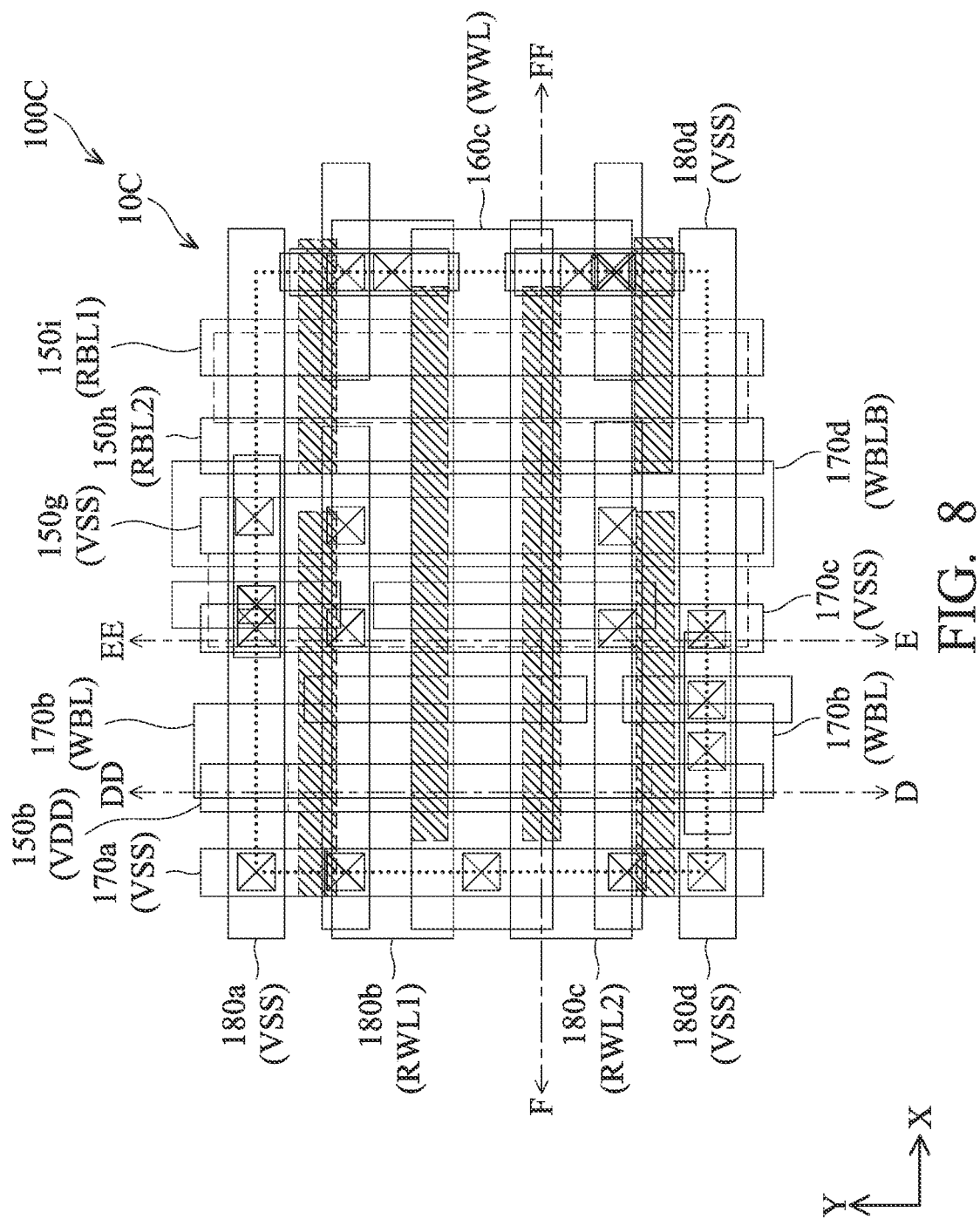
FIG. 8 shows a top view of the memory cell of FIG. 7, with all the depictions regarding components over the first metallization layer, in accordance with some embodiments of the disclosure.

FIG. 8 shows a top view of the memory cell 10C of FIG. 7, with all the depictions regarding components over the first metallization layer, in accordance with some embodiments of the disclosure.

The interconnect configuration of the memory cell 10C is similar to that of the memory cell 10A in FIG. 4A, and the differences between the memory cell 10C of FIG. 7 and the memory cell 10A of FIG. 4A is that the memory cell 10C includes the active structures 117a through 117c extending along the Y-direction. In the memory cell 10C, the same components as those in the memory cell 10A FIG. 4A are given the same reference numbers, and a detailed description thereof is thus omitted.

In the first metallization layer of the semiconductor device 100C of FIG. 8, the metal line 150b functions as the VDD conductor and the metal line 150g functions as the VSS conductor for the memory cell 10C. The metal line 150i functions as the first read bit line RBL1, and the metal line 150h functions as the second read bit line RBL2 for the memory cell 10C.

In the second metallization layer of the semiconductor device 100C of FIG. 8, the metal line 160c functions as the write word line WWL for the memory cell 10C.

In the third metallization layer of the semiconductor device 100C of FIG. 8, the metal lines 170a and 170c function as the VSS conductors for the memory cell 10C. The metal line 170b functions as the write bit line WBL and the metal line 170d functions as the write bit line WBLB for the memory cell 10C.

In the fourth metallization layer of the semiconductor device 100C of FIG. 8, the metal lines 180a and 180d function as the VSS conductors for the memory cell 10C. The metal line 180b functions as the first read word line RWL1 and the metal line 180c functions as the second read word line RWL2 for the memory cell 10C.

In SRAM application, the cell structure of the memory cell 10C can meet both high density (i.e., fewer active structure regions and fewer metal lines in each layer) and high speed (lower RC delay for both bit lines and word lines of read and write ports). Furthermore, the first read bit line RBL1 and the second read bit line RBL2 are arranged in the lowest metallization layer, thus decreasing the capacitance of the first read bit line RBL1 and the second read bit line RBL2, so as to increase the read port speed. On the other hand, the write bit lines WBL and WBLB are arranged in the higher metallization layer to obtain lower resistance, so as to improve the write margin for the memory cell 10C.

Figure 9A:
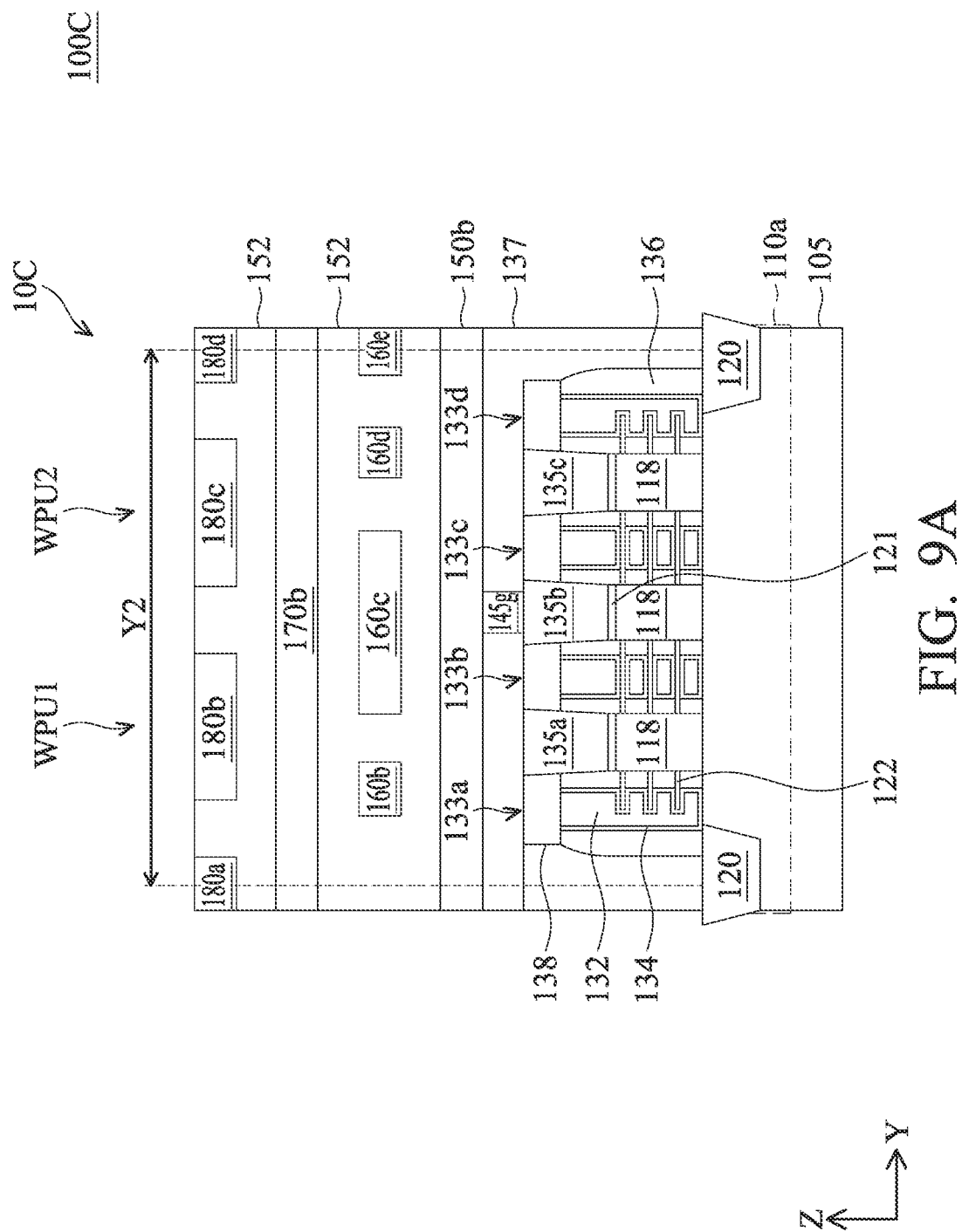
FIG. 9A shows a cross sectional view of the semiconductor device along a line D-DD in FIG. 7 and FIG. 8, in accordance with some embodiments of the disclosure.

FIG. 9A shows a cross sectional view of the semiconductor device 100C along a line D-DD in FIG. 7 and FIG. 8, in accordance with some embodiments of the disclosure. As described above, the memory cell 10C has a cell height (or cell pitch) of Y2 measured along the Y-direction. In FIG. 9A, the cross sectional view of the pull-up transistors WPU1 and WPU2 are illustrated, and the pull-up transistors WPU1 and WPU2 are P-type GAA FETs.

Figure 9B:
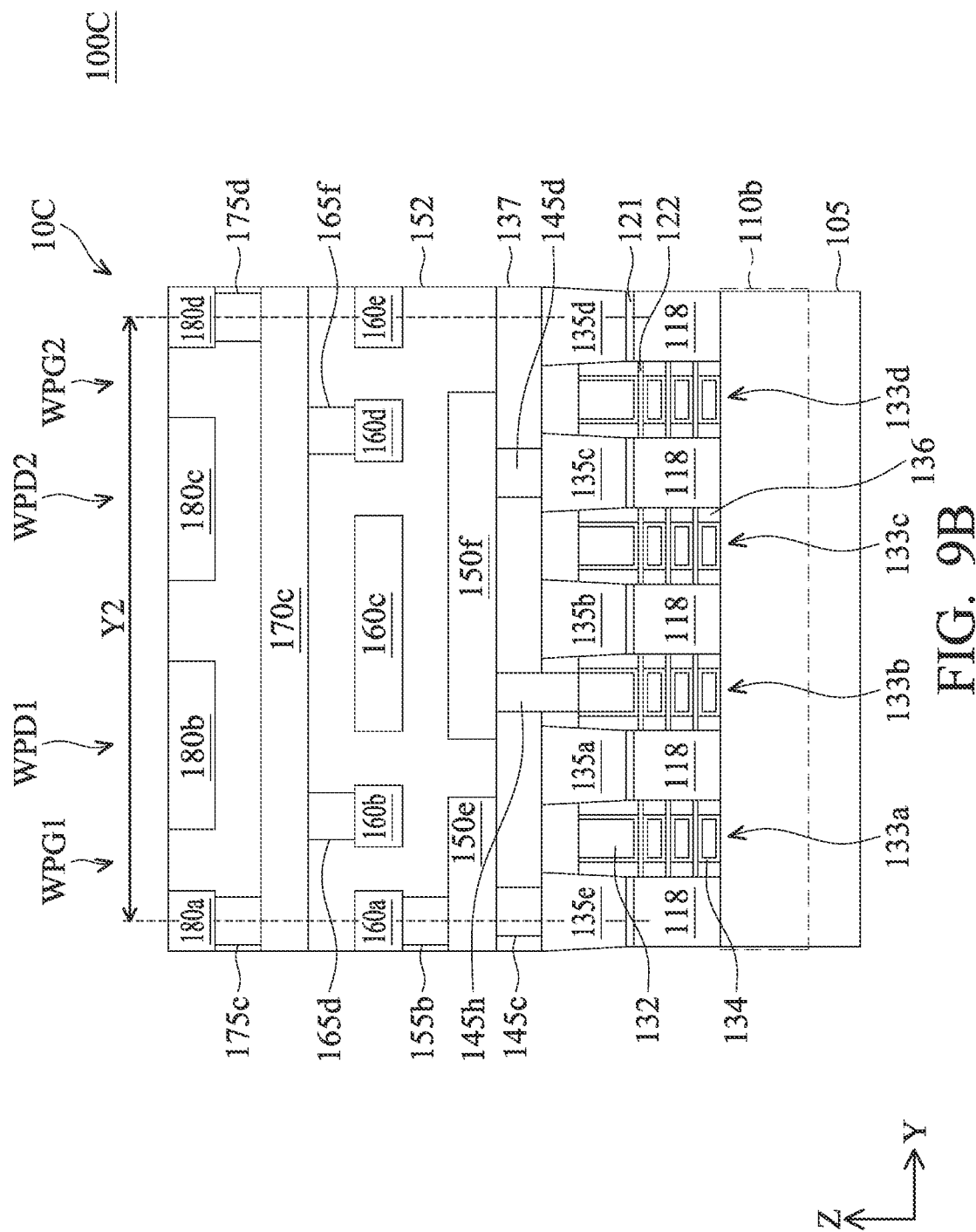
FIG. 9B shows a cross sectional view of the semiconductor device along a line E-EE in FIG. 7 and FIG. 8, in accordance with some embodiments of the disclosure.

FIG. 9B shows a cross sectional view of the semiconductor device 100C along a line E-EE in FIG. 7 and FIG. 8, in accordance with some embodiments of the disclosure. As described above, the memory cell 10C has a cell height (or cell pitch) of Y2 measured along the Y-direction. In FIG. 9B, the cross sectional view of the pull-down transistors WPD1 and WPD2 and the pass-gate transistors WPG1 and WPG2 are illustrated, and the pull-down transistors WPD1 and WPD2 and the pass-gate transistors WPG1 and WPG2 are N-type GAA FETs.

Figure 9C:
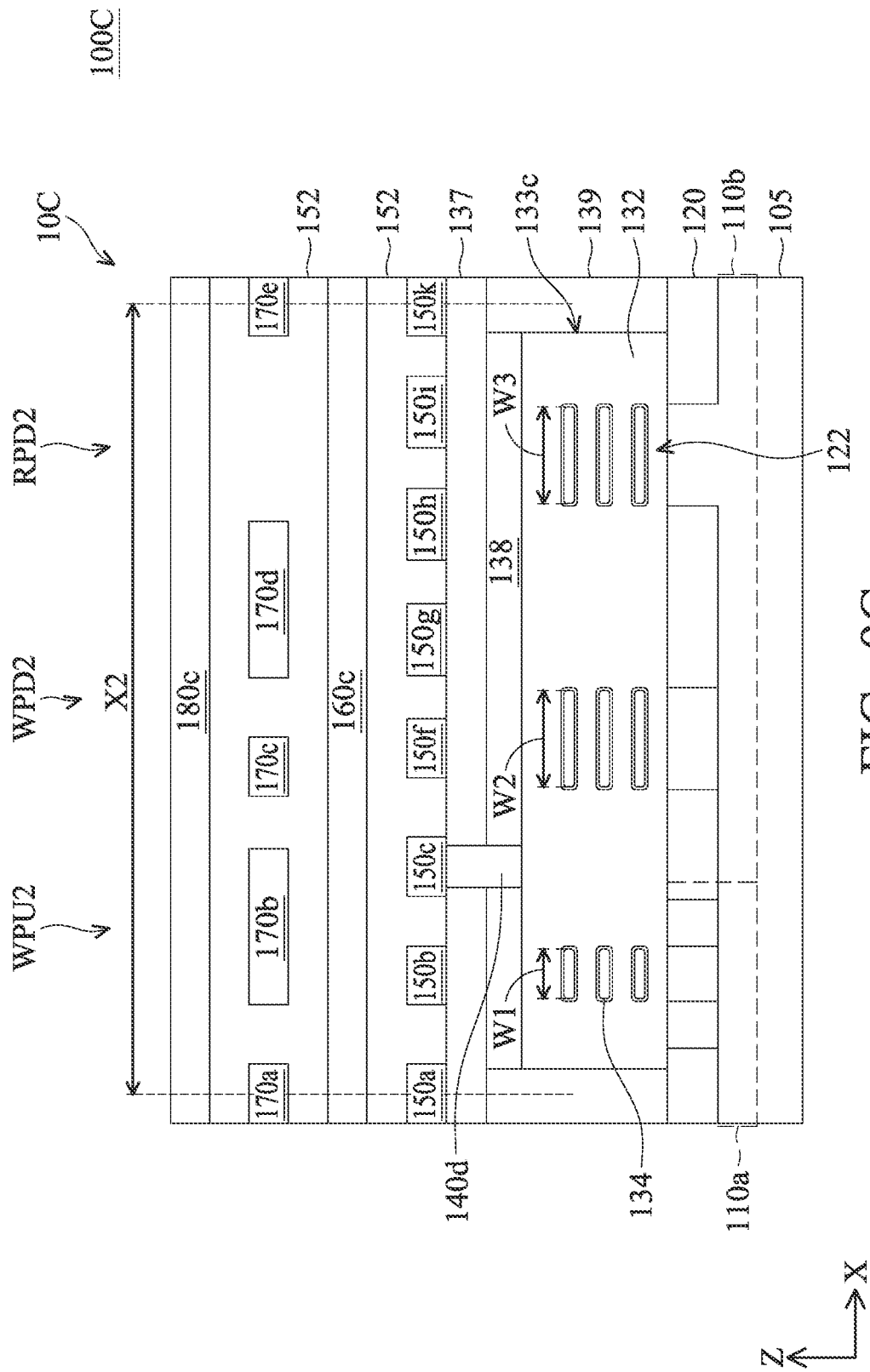
FIG. 9C shows a cross sectional view of the semiconductor device along a line F-FF in FIG. 7 and FIG. 8, in accordance with some embodiments of the disclosure.

FIG. 9C shows a cross sectional view of the semiconductor device 100C along a line F-FF in FIG. 7 and FIG. 8, in accordance with some embodiments of the disclosure. As described above, the memory cell 10C has a cell width (or cell pitch) of X2 measured along the Y-direction. In FIG. 9C, the cross sectional view of the pull-up transistor WPU2, and the pull-down transistor WPD2 and RPD2 are illustrated.

As shown in FIGS. 9A through 9C, the gate top dielectric layers 138 are over the gate structures 133a through 133f, the gate spacers 136, and the nanostructures 133. The material of the gate top dielectric layers 138 is discussed above.

The gate spacers 136 are on sidewalls of the gate structures 133a through 133f, as shown in FIGS. 9A and 9B. The gate spacers 136 may include the top spacers and the inner spacers. The top spacers are over the nanostructures 122 and on top sidewalls of the gate structures 133a through 133f. The top spacers may include multiple dielectric materials and be selected from a group consist of $SiO_2$, $Si_3N_4$, carbon doped oxide, nitrogen doped oxide, porous oxide, air gap, or a combination thereof. The inner spacers may include a dielectric material having higher K value (dielectric constant) than the top spacers and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), air gap, or a combination thereof.

The nanostructures 122 are wrapped by the gate structures 133a through 133f to serve as channels or channel layers of the transistors in the memory cell 10C. In FIGS. 9A through 9C, each GAA transistor has three nanostructures 122 vertically arranged (or stacked) in the Z-direction. In other embodiments, each GAA transistor may have more or fewer nanostructures 122 arranged vertically (or stacked) in the Z-direction.

In the memory cell 10C, the active structures 117a through 117c may have different widths in the X-direction. In some embodiments, the widths of the active structures 117a through 117c are determined according to the channel width of the channel width corresponding to the respective nanostructures 122.

As shown in FIG. 9C, the nanostructures 122 of the pull-up transistor WPU2 have a channel width W1 in the X-direction, the nanostructures 122 of the pull-down transistor WPD2 have a channel width W2 in the X-direction, and the nanostructures 122 of the pull-down transistor RPD2 have a channel width W3 in the X-direction. In such embodiments, the channel widths W2 and W3 are greater than the channel width W1. The dimension ratio of the channel width W2 to the channel width W1 is about 1.2 to about 5. Moreover, the dimension ratio of the channel width W3 to the channel width W2 is about 0.75 to about 3.

Each source/drain feature 118 is disposed between two adjacent gate structures and contact the nanostructures 122 of the transistors, as shown in FIGS. 9A and 9B. Therefore, each source/drain feature 118 is shared by two adjacent gate structures. In some embodiments, the source/drain features 118 may be also referred to as common source/drain features. As described above, the source/drain features 118 is formed by the epitaxially-grown materials discussed above.

The ILD 137 and the IMD 152 may include one or more dielectric layers including dielectric materials, such as tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or a combination thereof.

In some embodiments, the materials of the source/drain contact, the vias and metal lines in the memory cell 10C are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

Figure 10:
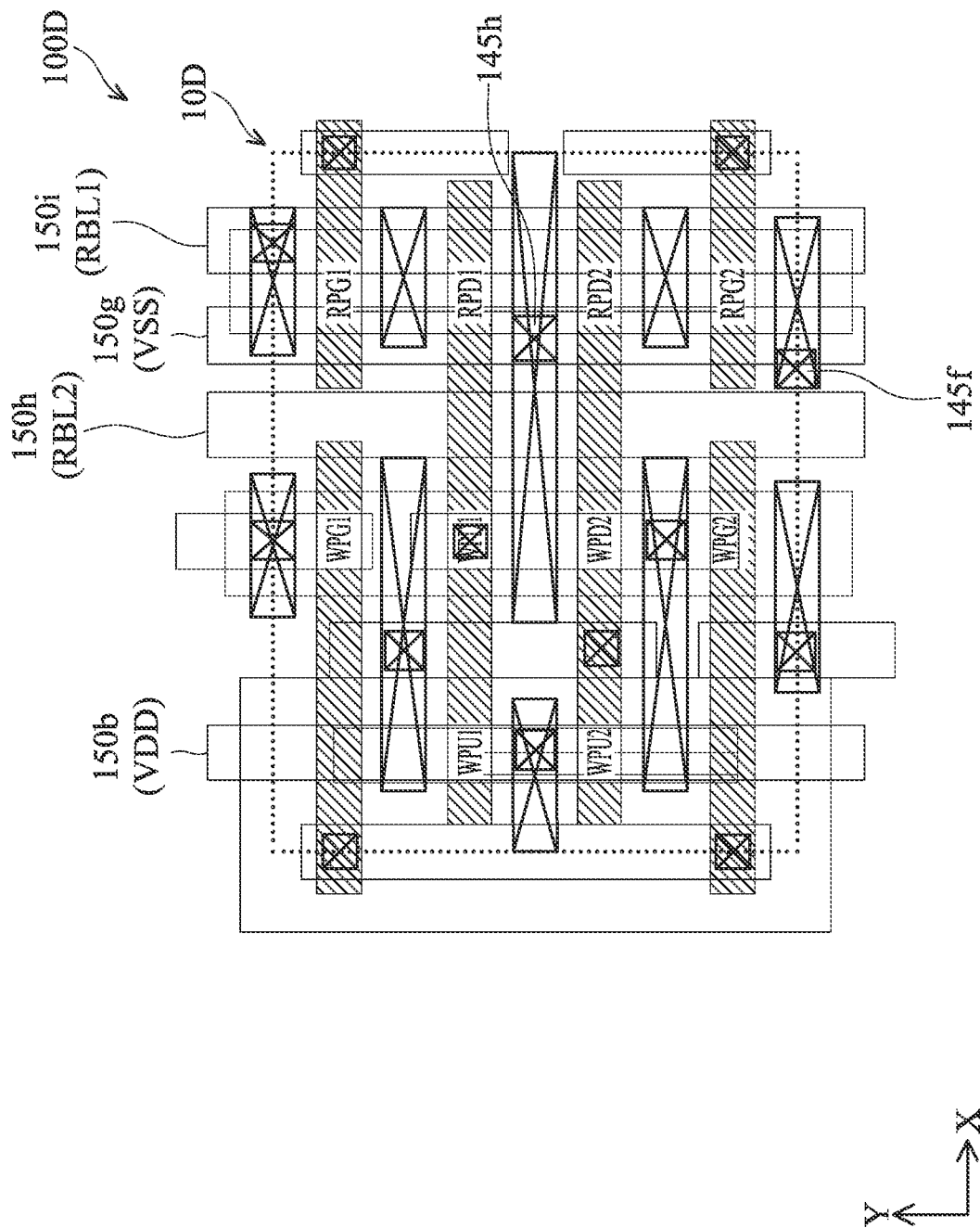
FIG. 10 shows is a top view of a memory cell in a semiconductor device, with all the depictions regarding components in and under the first metallization layer of FIG. 2, in accordance with some embodiments of the disclosure.

FIG. 10 shows is a top view of a memory cell 10D in a semiconductor device 100D, with all the depictions regarding components in and under the first metallization layer of FIG. 2, in accordance with some embodiments of the disclosure. Components in the memory cell 10D that are the same or similar to those in the memory cell 10C are given the same reference numbers, and a detailed description thereof is thus omitted. Some components of the memory cell 10D that are the same or similar to those in the memory cell 10C are not labeled for clarity. Moreover, the memory cell 10D is an implementation of the memory cell 10 depicted in FIG. 1.

The configuration of the memory cell 10D is similar to the configuration of the memory cell 10C in FIG. 7, and the differences between the memory cell 10D of FIG. 10 and the memory cell 10C of FIG. 7 is that the positions of the metal lines 150g and 150h are interchanged, and the corresponding vias 145h and 145f are also moved. Furthermore, the corresponding vias connected to the upper metal lines, are also moved. Therefore, the second read bit line RBL2 (i.e., the metal line 150h) is disposed between the VDD conductor (i.e., the metal line 150b) and the VSS conductor (i.e., the metal line 150g). Furthermore, the VSS conductor (i.e., the metal line 150g) is disposed between the second read bit line RBL2 (i.e., the metal line 150h) and the first read bit line RBL1 (i.e., the metal line 150i).

Figure 11A:
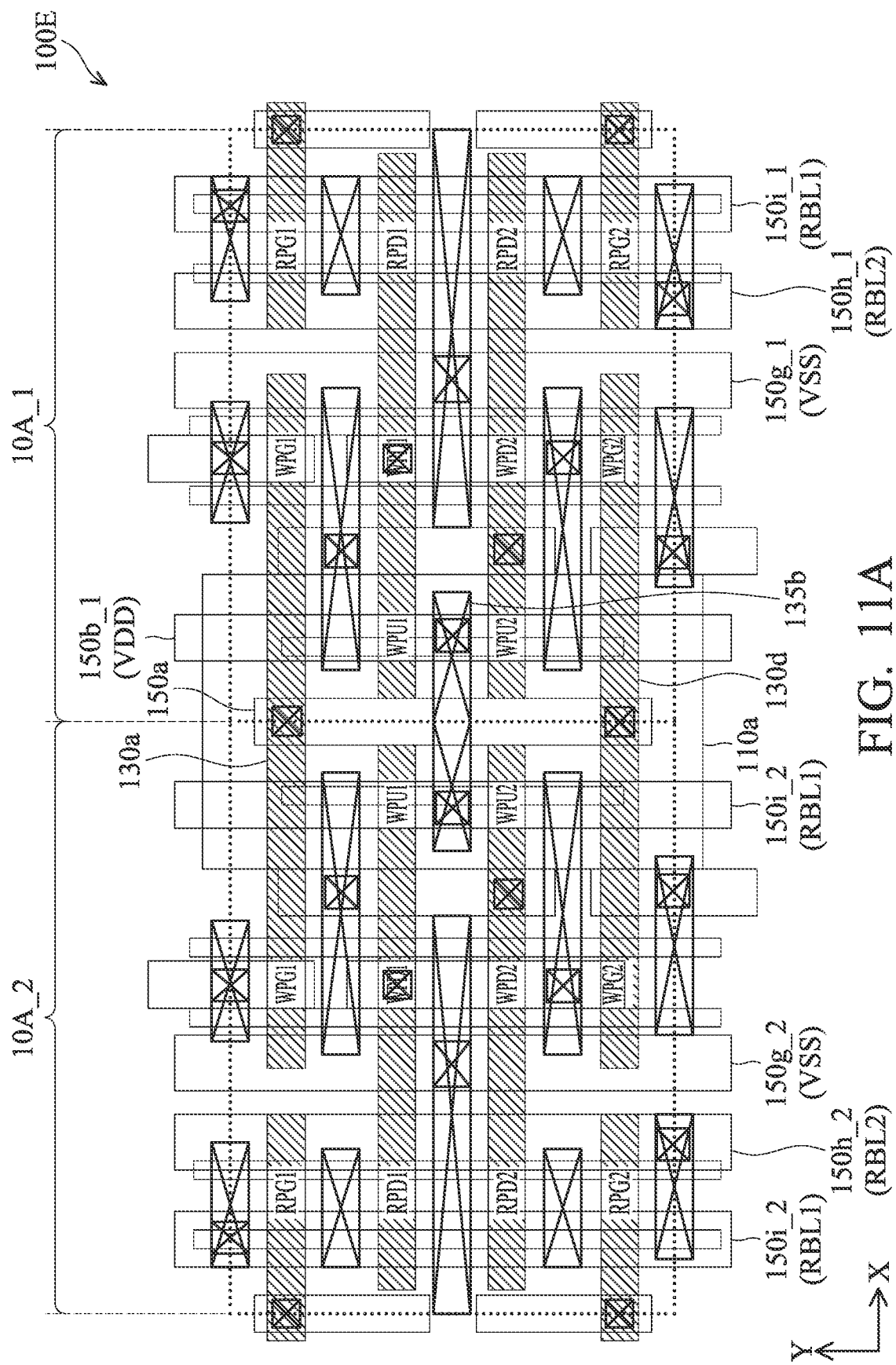
FIG. 11A shows a top view of the memory cells, with all the depictions regarding components in and under the first metallization layer of FIG. 2, in accordance with some embodiments of the disclosure.
Figure 11B:
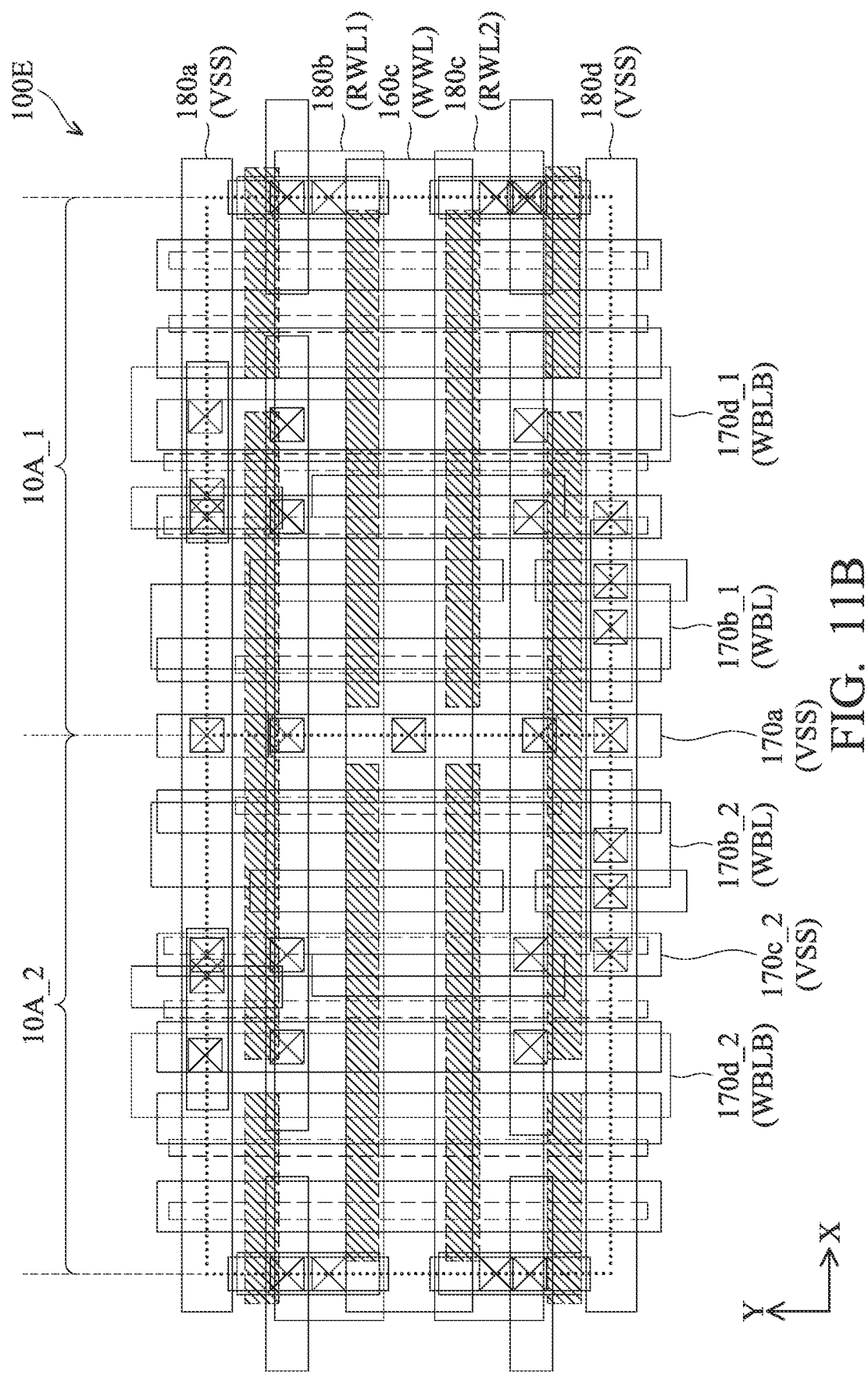
FIG. 11B shows a top view of the memory cells, with all the depictions regarding components over the first metallization layer, in accordance with some embodiments of the disclosure.

FIGS. 11A and 11B show the layout of a semiconductor device 100E, in accordance with some embodiments of the disclosure. In the semiconductor device 100E, two three-port memory cells are arranged in the same row and adjacent to each other. Furthermore, the two three-port memory cells have the same configuration as the memory cell 10A of FIGS. 3A, 4A through 4C, and are therefore designated 10A_1 and 10A_2. In other embodiments, the three-port memory cells have the same configuration as the memory cell 10B, 10C or 10D in the disclosure.

FIG. 11A shows a top view of the memory cells 10A_1 and 10A_2, with all the depictions regarding components in and under the first metallization layer of FIG. 2, in accordance with some embodiments of the disclosure. FIG. 11B shows a top view of the memory cells 10A_1 and 10A_2, with all the depictions regarding components over the first metallization layer, in accordance with some embodiments of the disclosure.

In the semiconductor device 100E, the two adjacent memory cells 10A_1 and 10A_2 are arranged in mirror symmetry along the Y-direction. In some embodiments, the two adjacent memory cells 10A_1 and 10A_2 are arranged in mirror symmetry along the X-direction.

The N-type well region 110a is at the middle of memory cells 10A_1 and 10A_2. The pull-up transistors WPU1 and WPU2 of the memory cells 10A_1 and 10A_2 are formed over the N-type well region 110a. Moreover, the source/drain contact 135b, the metal line 150a and the metal line 170a are shared by the pull-up transistors WPU1 and WPU2 of the memory cells 10A_1 and 10A_2.

The gate structure 130a is shared by the pass-gate transistors WPG1 of the memory cells 10A_1 and 10A_2, and the gate structure 130d is shared by the pass-gate transistors WPG2 of the memory cells 10A_1 and 10A_2.

The first read bit line RBL1 and the second read bit line RBL2 are electrically connected to the corresponding transistors of the memory cells in the same column of the semiconductor device 100E through respective metal lines extending in the Y-direction in the first metallization layer. For example, as shown in FIG. 11A, the metal lines 150i_1 and 150h_1 function as the first read bit line RBL1 and the second read bit line RBL2 of the memory cells arranged in the same column as the memory cell 10A_1. Moreover, the metal lines 150i_2 and 150h_2 function as the first read bit line RBL1 and the second read bit line RBL2 of the memory cells arranged in the same column as the memory cell 10A_2.

The write bit lines WBL and WBLB are electrically connected to the corresponding transistors of the memory cells in the same column of the semiconductor device 100E through respective metal lines extending in the Y-direction in the third metallization layer. For example, as shown in FIG. 11B, the metal lines 170b_1 and 170d_1 function as the write bit lines WBL and WBLB of the memory cells arranged in the same column as the memory cell 10A_1. Furthermore, the metal lines 170b_2 and 170d_2 function as the write bit lines WBL and WBLB of the memory cells arranged in the same column as the memory cell 10A_2.

The write word line WWL is electrically connected to the corresponding transistors of the memory cells in the same row of the semiconductor device 100E through the same metal line extending in the X-direction in the third second layer. For example, as shown in FIG. 11B, the metal line 160c is shared by the memory cells 10A_1 and 10A_2, and the metal line 160c function as the write word line WWL of the memory cells that arranged in the same row as the memory cells 10A_1 and 10A_2.

The first read word line RWL1 and the second read word line RWL2 are electrically connected to the corresponding transistors of the memory cells in the same row of the semiconductor device 100E through the respective metal lines extending in the X-direction in the fourth second layer. For example, as shown in FIG. 11B, the metal line 180b is shared by the memory cells 10A_1 and 10A_2, and the metal line 180b function as the first read word line RWL1 of the memory cells that arranged in the same row as the memory cells 10A_1 and 10A_2. Moreover, the metal line 180c is shared by the memory cells 10A_1 and 10A_2, and the metal line 180c function as the second read word line RWL2 of the memory cells that arranged in the same row as the memory cells 10A_1 and 10A_2.

The present disclosure provides front-end-of-line (FEOL) process, middle-end-of-line (MEOL) process, and back-end-of-line (BEOL) process for fabricating a memory cell that can be implemented within a data storage device. The memory cell of the present disclosure represents a multiple port memory cell having at least three ports, such as a write-port, a first read-port, and a second read-port. The disclosed FEOL process is used to form semiconductor devices of the memory cell onto diffusion layers and poly-silicon layers of a semiconductor layer stack. The disclosed MEOL process is used to form interconnections, such as one or more vias and/or one or more contacts to provide some examples, between the semiconductor devices and metallization layers of the semiconductor layer stack. The disclosed BEOL process is used to form the at least three ports onto the metallization layers of the semiconductor layer stack.

Figure 12:
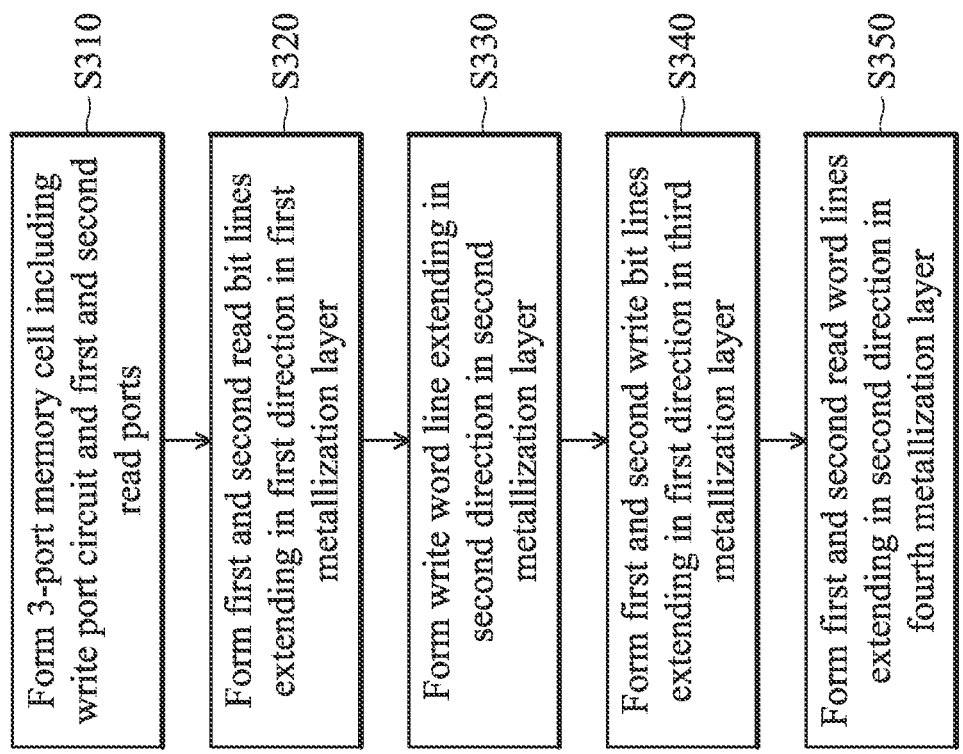
FIG. 12 shows a method for manufacturing a semiconductor device, in accordance with some embodiments of the disclosure.

FIG. 12 shows a method for manufacturing a semiconductor device, in accordance with some embodiments of the disclosure, and the semiconductor device includes the memory cell of the embodiments.

In operation S310, the 10 transistors of the 3-port memory cell are formed in the FEOL and MEOL processes. As described above, the 3-port memory cell includes a write port circuit having data nodes ND and NDB, a first read port circuit coupled to the data node NDB, and a second read port circuit coupled to the data node ND. Furthermore, the write port circuit includes the pull-up transistors WPU1 and WPU2, the pull-down transistors WPD1 and WPD2, and the pass-gate transistors WPG1 and WPG2. The first read port circuit includes the pass-gate transistor RPG1 and the pull-down transistor RPD1, and the second read port circuit includes the pass-gate transistor RPG2 and the pull-down transistor RPD2.

The transistors of the first and second read port circuits are formed on the same active structure extending in the first direction. The N-type transistors and the P-type transistors of the write port circuit are formed on the other two active structures extending in the first direction, respectively. The memory cells of the embodiments have fully symmetry layout for cell stability improvement and device match.

Moreover, the pull-down transistors WPD1 and RPD1 and the pull-up transistor WPU1 share one gate structure extending in a second direction, while the pull-down transistors WPD2 and RPD2 and the pull-up transistor WPU2 share another gate structure extending in the second direction, and the two gate structures are adjacent to each other. The first second direction is perpendicular to the second direction.

In some embodiments, the 10 transistors are formed by fin-base transistors, the transistors may be single-fin, multiple fins, or combination. In some embodiments, the 10 transistors are formed by the vertically stacked gate-all-around (VS-GAA) horizontal nanostructure transistors, and the transistors may be single channel, or multiple vertically stacked nano-sheet (or nano-wire), or combination.

In operation S320, the read bit lines RBL1 and RBL2 are formed in a first metallization layer over the transistors during the BEOL process. In the first metallization layer, the read bit lines RBL1 and RBL2 extend in the first direction. Furthermore, the memory cells arranged in the same column of array may share the same read bit lines RBL1 and RBL2.

In operation S330, the write word line WWL is formed in a second metallization layer over the first metallization layer during the BEOL process. In the second metallization layer, the write word line WWL extends in the second direction. Furthermore, the memory cells arranged in the same row of array may share the same write word line WWL.

In operation S340, the write bit lines WBL and WBLB are formed in a third metallization layer over the second metallization layer during the BEOL process. In the third metallization layer, the write bit lines WBL and WBLB extend in the first direction. Furthermore, the memory cells arranged in the same column of array may share the same write bit lines WBL and WBLB.

In operation S350, the read word lines RWL1 and RWL2 are formed in a fourth metallization layer over the third metallization layer during the BEOL process. In the fourth metallization layer, the read word lines RWL1 and RWL2 extend in the second direction. Furthermore, the memory cells arranged in the same row of array may share the same read word lines RWL1 and RWL2.

Embodiments of semiconductor devices are provided. The semiconductor devices include the 3-port memory cells arranged in a memory array. In each memory cell, all transistors of the first and second read port circuits share at least one first active structure. The N-type transistors of the write port circuit share at least one second active structure, and the P-type transistors of the write port circuit share a third active structure. Therefore, the fewer active structure regions and fewer metal lines in each layer are used in the memory cells. Furthermore, the write word line WWL and the read word lines RWL1 and RWL2 are arranged to different metal layers in the memory cell, thereby obtaining wider metal width and space for RC delay improvement.

In some embodiments, a semiconductor device is provided. The semiconductor device includes a three-port memory cell. The three-port memory cell includes a write port circuit, a first read port circuit and a third read port circuit. The write port circuit is configured to perform a write function according to a write word line, a first write bit line and a second write bit line. The first read port circuit includes a first read pass-gate transistor and a first read pull-down transistor connected in series, and is configured to perform a first read function according to a first read bit line and a first read word line. The second read port circuit includes a second read pass-gate transistor and a second read pull-down transistor connected in series, and is configured to perform a second read function according to a second read bit line and a second read word line. The first and second read pass-gate transistors and the first and second read pull-down transistors share a first active structure extending in a first direction. The first read bit line and the second read bit line extend in the first direction in a first metallization layer over the first active structure, and the first write bit line and the second write bit line extend in the first direction in a second metallization layer over the first metallization layer. The write word line extends in a second direction in a third metallization layer, and the first read word line and the second read word line extend in the second direction in a fourth metallization layer. The first direction is perpendicular to the second direction, and the third and fourth metallization layers are different from the first and second metallization layers.

In some embodiments, a semiconductor device is provided. The semiconductor device includes a three-port memory cell. The three-port memory cell includes a write port circuit, a first read port circuit, and a second read port circuit. The write port circuit is configured to perform a write function according to a write word line, a first write bit line and a second write bit line. The first read port circuit includes a first read pass-gate transistor and a first read pull-down transistor connected in series between a ground and a first read bit line, and is configured to perform a first read function according to and a first read word line. The second read port circuit includes a second read pass-gate transistor and a second read pull-down transistor connected in series between a ground and a second read bit line, and is configured to perform a second read function according to a second read word line. The first and second read pass-gate transistors and the first and second read pull-down transistors share a first active structure extending in a first direction. The first and second write pass-gate transistors share a second active structure extending in the first direction. The first and second write pass-gate transistors share a third active structure extending in the first direction. The second active structure is disposed between the first and third active structures. The first read bit line and the second read bit line extend in the first direction in a first metallization layer over the first active structure, and the first write bit line and the second write bit line extend in the first direction in a second metallization layer over the first metallization layer.

In some embodiments, a method for manufacturing a semiconductor device is provided. A three-port memory cell is formed. The three-port memory cell includes a write port circuit, a first read port circuit including a first read pass-gate transistor and a first read pull-down transistor connected in series, and a second read port circuit including a second read pass-gate transistor and a second read pull-down transistor connected in series. The first and second read pass-gate transistors and the first and second read pull-down transistors share a first active structure extending in a first direction. A first read bit line and a second read bit line extending in the first direction are formed in a first metallization layer over the first active structure. A write word line extending in a second direction is formed in a second metallization layer over the first metallization layer. A first write bit line and a second write bit line extending in the first direction are formed in a third metallization layer over the second metallization layer. A first read word line and a second read word line extending in the second direction are formed in a fourth metallization layer over the third metallization layer. The write port circuit is configured to perform a write function according to the write word line, the first write bit line and the second write bit line. The first read port circuit is configured to perform a first read function according to the first read bit line and the first read word line. The second read port circuit is configured to perform a second read function according to the second read bit line and the second read word line.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a three-port memory cell, comprising:
a write port circuit configured to perform a write function according to a write word line, a first write bit line and a second write bit line;
a first read port circuit comprising a first read pass-gate transistor and a first read pull-down transistor connected in series, and configured to perform a first read function according to a first read bit line and a first read word line; and
a second read port circuit comprising a second read pass-gate transistor and a second read pull-down transistor connected in series and configured to perform a second read function according to a second read bit line and a second read word line,
wherein the first and second read pass-gate transistors and the first and second read pull-down transistors share a first active structure extending in a first direction,
wherein the first read bit line and the second read bit line extend in the first direction in a first metallization layer over the first active structure, and the first write bit line and the second write bit line extend in the first direction in a second metallization layer over the first metallization layer,
wherein the write word line extends in a second direction in a third metallization layer, and the first read word line and the second read word line extend in the second direction in a fourth metallization layer,
wherein the first direction is perpendicular to the second direction, and the third and fourth metallization layers are different from the first and second metallization layers,
wherein the first metallization layer is the lowest metallization layer, the third metallization layer is formed between the first and second metallization layers, and the second metallization layer is formed between the third and fourth metallization layers.

2. The semiconductor device as claimed in claim 1, further comprising:
a first VSS conductor extending in the first direction in the first metallization layer,
wherein the first VSS conductor is adjacent the second read bit line,
wherein the second read bit line is disposed between the first VSS conductor and the first read bit line or the first VSS conductor is disposed between the first and second read bit lines.

3. The semiconductor device as claimed in claim 1, further comprising:
a second VSS conductor extending in the first direction in the second metallization layer,
wherein the second VSS conductor is disposed between the first and second write bit lines, and the first and second write bit lines are wider than the second VSS conductor.

4. The semiconductor device as claimed in claim 1, wherein the three-port memory cell further comprises:
a first gate structure, a second gate structure, a third gate structure and a fourth gate structure extending in the second direction,
wherein the first, second, third and fourth gate structures form channel regions of the first read pass-gate transistor, the first read pull-down transistor, the second read pull-down transistor, and the second read pass-gate transistor, respectively,
wherein the second and third gate structures are disposed between the first and fourth gate structures.

5. The semiconductor device as claimed in claim 4, wherein the first, second, third and fourth gate structures have a gate pitch, and a cell height of the three-port memory cell in the first direction is the same as 4 times the gate pitch.

6. The semiconductor device as claimed in claim 1, wherein the write port circuit comprises:
a first write pull-up transistor and a first write pull-down transistor connected in series; and
a second write pull-up transistor and a second write pull-down transistor connected in series,
wherein the first and second write pull-up transistors share a second active structure extending in the first direction, and the first and second write pull-down transistors share a third active structure extending in the first direction,
wherein the third active structure is disposed between the first and second active structures.

7. The semiconductor device as claimed in claim 6, wherein the first write pull-up transistor, the first write pull-down transistor and the first read pull-down transistor share a first gate structure extending in the second direction, and the second write pull-up transistor, the second write pull-down transistor and the second read pull-down transistor share a second gate structure extending in the second direction.

8. The semiconductor device as claimed in claim 6, wherein the write port circuit further comprises:
a first write pass-gate transistor and a second write pass-gate transistor,
wherein the first and second write pass-gate transistors share the third active structure.

9. The semiconductor device as claimed in claim 6, wherein a channel width or fin number of the first and second write pull-up transistors is less than that of the first and second write pull-down transistors and the first and second read pull-down transistors.

10. A semiconductor device, comprising:
a three-port memory cell, comprising:
a write port circuit configured to perform a write function according to a write word line, a first write bit line and a second write bit line, and comprising:
a first write pass-gate transistor and a first write pull-up transistor coupled in series between a supply voltage and the first write bit line; and
a second write pass-gate transistor and a second write pull-up transistor coupled in series between the supply voltage and the second write bit line;
a first read port circuit comprising a first read pass-gate transistor and a first read pull-down transistor connected in series between a ground and a first read bit line, and configured to perform a first read function according to a first read word line;
a second read port circuit comprising a second read pass-gate transistor and a second read pull-down transistor connected in series between the ground and a second read bit line, and configured to perform a second read function according to a second read word line; and
a first gate structure, a second gate structure, a third gate structure and a fourth gate structure extending in a second direction,
wherein the first and second read pass-gate transistors and the first and second read pull-down transistors share a first active structure extending in a first direction, the first and second write pass-gate transistors share a second active structure extending in the first direction, and the first and second write pull-up transistors share a third active structure extending in the first direction, and the second active structure is disposed between the first and third active structures,
wherein the first read bit line and the second read bit line extend in the first direction in a first metallization layer over the first active structure, and the first write bit line and the second write bit line extend in the first direction in a second metallization layer over the first metallization layer,
wherein the first, second, third and fourth gate structures form channel regions of the first read pass-gate transistor, the first read pull-down transistor, the second read pull-down transistor, and the second read pass-gate transistor, respectively,
wherein the first write pull-up transistor and the first read pull-down transistor share the second gate structure, and the second write pull-up transistor and the second read pull-down transistor share the third gate structure.

11. The semiconductor device as claimed in claim 10, wherein the write word line extends in the second direction in a third metallization layer, and the first read word line and the second read word line extend in the second direction in a fourth metallization layer, wherein the first direction is perpendicular to the second direction, and the third and fourth metallization layers are different from the first and second metallization layers.

12. The semiconductor device as claimed in claim 11, wherein the first metallization layer is the lowest metallization layer, the third metallization layer is formed between the first and second metallization layers, and the second metallization layer is formed between the third and fourth metallization layers.

13. The semiconductor device as claimed in claim 10, wherein the first, second, third and fourth gate structures have a gate pitch, and a cell height of the three-port memory cell in the first direction is the same as 4 times the gate pitch.

14. The semiconductor device as claimed in claim 10, wherein the write port circuit further comprises:
a first write pull-down transistor and a second write pull-down transistor,
wherein the first and second write pull-down transistors and the first and second write pass-gate transistors share the second active structure,
wherein the first write pull-up transistor, the first write pull-down transistor and the first read pull-down transistor share the second gate structure, and the second write pull-up transistor, the second write pull-down transistor and the second read pull-down transistor share the third gate structure.

15. The semiconductor device as claimed in claim 10, wherein the second read port circuit further comprises:
a first source/drain contact of the second read pass-gate transistor; and
a first via electrically connecting the first source/drain contact to the second read bit line.

16. The semiconductor device as claimed in claim 10, further comprising:
a first VSS conductor extending in the first direction in the first metallization layer,
wherein the first VSS conductor is adjacent the second read bit line,
wherein the second read bit line is disposed between the first VSS conductor and the first read bit line.

17. The semiconductor device as claimed in claim 16, wherein the three-port memory cell further comprises:
a second source/drain contact shared by the first write pull-down transistor and the first read pull-down transistor; and
a second via electrically connecting the second source/drain contact to the first VSS conductor.

18. A method for manufacturing a semiconductor device, comprising:
forming a three-port memory cell, wherein the three-port memory cell comprises:
a write port circuit;
a first read port circuit comprising a first read pass-gate transistor and a first read pull-down transistor connected in series; and
a second read port circuit comprising a second read pass-gate transistor and a second read pull-down transistor connected in series,
wherein the first and second read pass-gate transistors and the first and second read pull-down transistors share a first active structure extending in a first direction;
forming a first read bit line and a second read bit line that extend in the first direction in a first metallization layer over the first active structure;

forming a write word line that extends in a second direction in a second metallization layer over the first metallization layer;

forming a first write bit line and a second write bit line that extend in the first direction in a third metallization layer over the second metallization layer;

forming a first read word line and a second read word line that extend in the second direction in a fourth metallization layer over the third metallization layer; and forming a first VSS conductor that extends in the first direction in the first metallization layer, wherein the first VSS conductor is adjacent the second read bit line, wherein the second read bit line is disposed between the first VSS conductor and the first read bit line or the first VSS conductor is disposed between the first and second read bit lines, wherein the write port circuit is configured to perform a write function according to the write word line, the first write bit line and the second write bit line, wherein the first read port circuit is configured to perform a first read function according to the first read bit line and the first read word line, and the second read port circuit is configured to perform a second read function according to the second read bit line and the second read word line.

19. The method as claimed in claim 18, further comprising:

forming a second VSS conductor that extends in the first direction in the third metallization layer, wherein the second VSS conductor is disposed between the first and second write bit lines, and the first and second write bit lines are wider than the second VSS conductor.

20. The method as claimed in claim 18, wherein the three-port memory cell further comprises:

a first gate structure, a second gate structure, a third gate structure and a fourth gate structure extending in the second direction, wherein the first, second, third and fourth gate structures form channel regions of the first read pass-gate transistor, the first read pull-down transistor, the second read pull-down transistor, and the second read pass-gate transistor, respectively, wherein the second and third gate structures are disposed between the first and fourth gate structures.

* * * * *